(12) United States Patent
Hiratsuka et al.

(10) Patent No.: US 11,296,672 B2
(45) Date of Patent: Apr. 5, 2022

(54) SURFACE ACOUSTIC WAVE DEVICE

(71) Applicant: NDK SAW Devices Co., Ltd., Hokkaido (JP)

(72) Inventors: Yuya Hiratsuka, Saitama (JP); Kazuhiro Hirota, Saitama (JP)

(73) Assignee: NDK SAW Devices Co., Ltd., Hokkaido (JP)

( * ) Notice: Subject to any disclaimer, the term of this patent is extended or adjusted under 35 U.S.C. 154(b) by 0 days.

(21) Appl. No.: 16/286,541

(22) Filed: Feb. 26, 2019

(65) Prior Publication Data

US 2019/0267966 A1 Aug. 29, 2019

(30) Foreign Application Priority Data

Feb. 27, 2018 (JP) .............................. JP2018-033709

(51) Int. Cl.
*H03H 9/02* (2006.01)
*H03H 9/64* (2006.01)
*H03H 9/15* (2006.01)

(52) U.S. Cl.
CPC .......... *H03H 9/02551* (2013.01); *H03H 9/15* (2013.01); *H03H 9/6483* (2013.01)

(58) Field of Classification Search
CPC .............................................. H03H 9/54–72
See application file for complete search history.

(56) References Cited

U.S. PATENT DOCUMENTS

| 7,336,016 | B2 | 2/2008 | Oshio | |
| 7,489,064 | B2 * | 2/2009 | Kando | H03H 9/0222 |
| | | | | 310/313 A |
| 9,484,885 | B2 * | 11/2016 | Watanabe | H03H 9/0222 |
| 2004/0189425 | A1 | 9/2004 | Iwashita et al. | |
| 2015/0155851 | A1 | 6/2015 | Tsutsumi et al. | |
| 2015/0319537 | A1 | 11/2015 | Perois et al. | |
| 2018/0294793 | A1 | 10/2018 | Tanno et al. | |

(Continued)

FOREIGN PATENT DOCUMENTS

| JP | H06326553 | 11/1994 |
| JP | 2006135443 | 5/2006 |

(Continued)

OTHER PUBLICATIONS

Tsutomu Takai, et al., "I.H.P. Saw Technology and its Application to Microacoustic Components (Invited)," Ultrasonic Symp., Sep. 2017, pp. 1-8.

(Continued)

*Primary Examiner* — Dean O Takaoka
*Assistant Examiner* — Alan Wong
(74) *Attorney, Agent, or Firm* — JCIPRNET

(57) ABSTRACT

A surface acoustic wave device includes a quartz layer, an amorphous silicon oxide layer, a piezoelectric layer, and an Inter Digital Transducer. The amorphous silicon oxide layer is laminated on the quartz layer. The piezoelectric layer is laminated on the amorphous silicon oxide layer. The Inter Digital Transducer is formed on the piezoelectric layer. The Inter Digital Transducer excites a surface acoustic wave on the piezoelectric layer. Assuming that the surface acoustic wave has a wavelength $\lambda$, $0.1 \leq$ a thickness of the amorphous silicon oxide layer/$\lambda \leq 1$, and $0.08 <$ a thickness of the piezoelectric layer/$\lambda \leq 1$.

10 Claims, 19 Drawing Sheets

(56) References Cited

U.S. PATENT DOCUMENTS

2019/0036009 A1    1/2019  Tai et al.
2019/0288661 A1    9/2019  Akiyama et al.
2019/0319603 A1*  10/2019  Kadota .............. H03H 9/02574

FOREIGN PATENT DOCUMENTS

| JP | 4385607 | 12/2009 |
|----|---------|---------|
| JP | 2015106857 | 6/2015 |
| JP | 2015537492 | 12/2015 |
| JP | 6250856 | 12/2017 |
| JP | 2018026695 | 2/2018 |
| TW | 201722074 | 6/2017 |
| WO | 2017132183 | 8/2017 |
| WO | 2017163722 | 9/2017 |

OTHER PUBLICATIONS

Shoji Kakio, et al., "High-Coupling Leaky Surface Acoustic Waves on LiNbO3 or LiTaO3 Thin Plate Bonded to Quartz Substrate," 46th EM Symposium, Jun. 2017, pp. 1-13.
"Office Action of Taiwan Counterpart Application" with English translation thereof, dated Mar. 5, 2021, p. 1-p. 12.
Office Action of Japan Counterpart Application, with English translation thereof, dated Aug. 3, 2021, pp. 1-9.
Office Action of Japan Counterpart Application, with English translation thereof, dated Nov. 2, 2021, pp. 1-7.

* cited by examiner

SURFACE ACOUSTIC WAVE DEVICE

CROSS-REFERENCE TO RELATED APPLICATIONS

This application is based on and claims priority under 35 U.S.C. § 119 to Japanese Patent Application No. 2018-033709, filed on Feb. 27, 2018, and the entire content of which is incorporated herein by reference.

TECHNICAL FIELD

This disclosure relates to a surface acoustic wave device that uses a surface acoustic wave (SAW).

DESCRIPTION OF THE RELATED ART

Recent development of mobile communication systems, such as a mobile phone, increases requests for a SAW filter that has a narrow band and a steep attenuation characteristic. Therefore, there has been reported various methods for improving obtaining satisfactory values of an electromechanical coupling coefficient $k^2$ and a Temperature Coefficients of Frequency (TCF) as an indicator of a frequency versus temperature characteristic. As the improving method, there has been reported that the SAW filter is configured using a substrate where a piezoelectric substrate having a thickness about a wavelength and a high-acoustic-velocity substrate are laminated. Such a method using the laminated substrate has been known also as a method for improving characteristics of, not only the SAW filter, but other surface acoustic wave devices such as a SAW resonator.

"I.H.P. SAW Technology and its Application to Microacoustic Components (Invited)" (Tsutomu Takai et al., Ultrasonic Symp., 2017) discloses a SAW resonator that uses a substrate where a 42° Y—X $LiTaO_3$ substrate, an amorphous $SiO_2$ film, an AlN substrate, and a Si layer are laminated in this order from the top. The document discloses that such a configuration provides a temperature compensation effect by amorphous $SiO_2$, a confinement of a vibration energy by AlN as a high-acoustic-velocity substrate, and a heat radiation by Si, thus improving respective characteristics of a Q factor, the $k^2$, and the TCF compared with a case where the SAW resonator is configured with the 42° Y—X $LiTaO_3$ substrate alone. However, these characteristics are required to be improved with more simple structures.

High-Coupling Leaky SAWs on $LiNbO_3.LiTaO_3$ Thin Plate Bonded to Quartz Substrate (46th EM Symposium, EM46-2-01) reports that a LeakySAW (LSAW) resonator is configured using a substrate (for convenience of explanation, referred to as a LT-quartz bonded substrate) where a 36° Y—X $LiTaO_3$ substrate and an AT-90° X quartz substrate are bonded in this order from the top. The document discloses that use of this LT-quartz bonded substrate can improve the Q factor, the $k^2$, and the TCF compared with a case where the LSAW resonator is configured with the $LiTaO_3$ substrate alone. For this LSAW resonator with the LT-quartz bonded substrate, the Q factor is 12050 and a fractional bandwidth is 5.7% in resonance at the above-described $LiTaO_3$ substrate thickness/$\lambda$=0.15 and an Inter Digital Transducer (IDT) thickness/$\lambda$=0.09. The Inter Digital Transducer is formed on this $LiTaO_3$ substrate and made of Al (aluminum). The $\lambda$ is a wavelength of a surface acoustic wave. The Q factor is 1350 and the fractional bandwidth is 4.4% in the resonance when the LSAW resonator is configured with the $LiTaO_3$ substrate alone. Therefore, the use of the LT-quartz bonded substrate significantly increases the Q factor and the fractional bandwidth increases as well.

These Q factor and fractional bandwidth are obtained as results of a calculation with a finite element method (FEM) under a condition where infinite periodic structures are assumed on both sides of the IDT of one period as a period boundary condition, and a perfect matching layer is assumed on a bottom surface of this IDT. While the TCF has not been clearly described, it is considered that a calculated value is approximately ±2 ppm/° C. under the condition of a short-circuited substrate surface. However, it has been found that for this LT-quartz bonded substrate, under the condition where the IDT is disposed on the substrate, the TCF shifts in a negative direction to be degraded. When the thickness of the IDT in this LSAW resonator is relatively increased, the TCF of a resonance frequency and the TCF of an anti-resonance frequency are each degraded. To prevent the degradations of these TCF values, the thickness of the $LiTaO_3$ substrate should be more decreased, while the decrease of the thickness of the $LiTaO_3$ substrate degrades the $k^2$. Therefore, it is also difficult to obtain sufficient values of respective characteristics of the device using such an LT-quartz bonded substrate.

Incidentally, Japanese Unexamined Patent Application Publication No. H6-326553 discloses the above-described SAW device that includes an amorphous $SiO_2$ (oxidation silicon) film. This Japanese Unexamined Patent Application Publication No. H6-326553 discloses a surface acoustic wave element that includes a single crystal piezoelectric substrate, an inorganic thin film layer made of amorphous $SiO_2$, and a quartz-crystal laminated in this order from a top, and discloses that the above-described inorganic thin film layer is disposed to capture dusts on a bonded interface between the single crystal piezoelectric substrate and the quartz-crystal, and the inorganic thin film layer is configured to be equal to or less than ½ wavelength. Japanese Unexamined Patent Application Publication No. H6-326553 also discloses a surface acoustic wave element that includes a single crystal piezoelectric substrate and a quartz-crystal directly laminated without an inorganic thin film layer, and discloses that in this case, to excite an Inter Digital Transducer disposed on the single crystal piezoelectric substrate at 200 MHz, this single crystal piezoelectric substrate is configured to have a thickness of ¼ wavelength to three wavelength.

However, as described in DETAILED DESCRIPTION, the validation by the inventor has confirmed that the characteristics of the device vary depending on the combination of the respective thicknesses of the single crystal piezoelectric substrate and the amorphous $SiO_2$ film, and an appropriate combination of the respective thicknesses has not been examined for the thicknesses of the respective layers in Japanese Unexamined Patent Application Publication No. H6-326553. Furthermore, the SAW device disclosed in Japanese Unexamined Patent Application Publication No. H6-326553 is used at 200 MHz as described above, and an appropriate configuration in the use in a GHz band has not been indicated.

A need thus exists for a surface acoustic wave device which is not susceptible to the drawback mentioned above.

SUMMARY

According to an aspect of this disclosure, there is provided a surface acoustic wave device that includes a quartz layer, an amorphous silicon oxide layer, a piezoelectric layer, and an Inter Digital Transducer. The amorphous silicon oxide layer is laminated on the quartz layer. The piezoelectric layer is laminated on the amorphous silicon oxide layer. The Inter Digital Transducer is formed on the piezoelectric layer. The Inter Digital Transducer excites a surface acoustic wave on the piezoelectric layer. Assuming that the surface acoustic wave has a wavelength λ, 0.1≤a thickness of the amorphous silicon oxide layer/λ≤1, and 0.08<a thickness of the piezoelectric layer/λ≤1.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1:
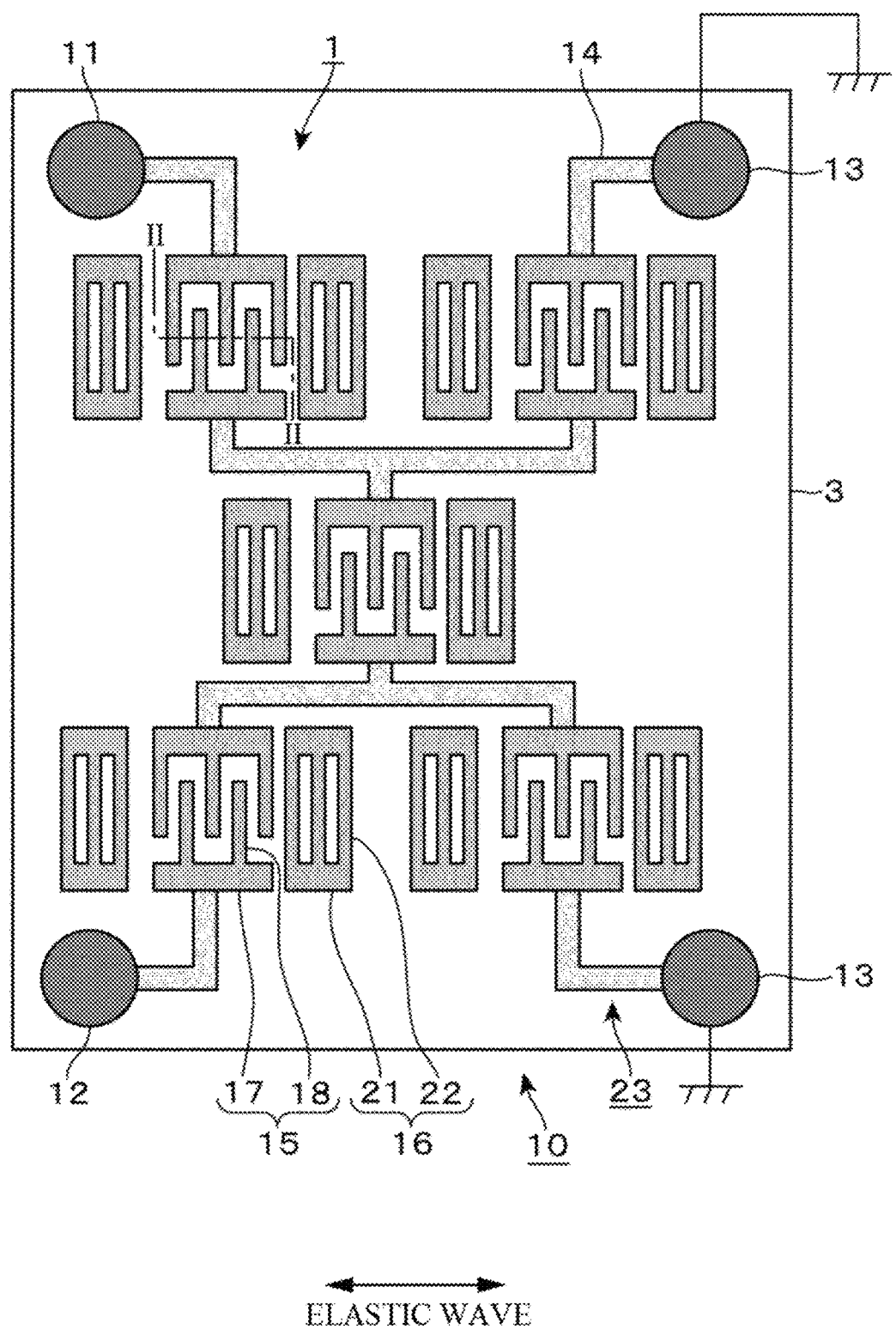
FIG. 1 is a plan view of a ladder-type filter as an exemplary SAW device of the embodiment.

FIG. 1 illustrates a ladder-type filter 10 where a plurality of surface acoustic wave (SAW) resonators 1 are combined in a ladder-type, as one embodiment of a surface acoustic wave device of the disclosure. In this ladder-type filter 10, three SAW resonators 1 are each disposed between an input port 11 and an output port 12 in series as a series arm, while one SAW resonator 1 is connected to those SAW resonators 1, 1 in parallel as a parallel arm. Each SAW resonator 1 is simply illustrated. A reference numeral 13 in the drawing denotes a ground port. A reference numeral 14 in the drawing denotes a routing electrode that electrically connects the SAW resonators 1, 1 one another or electrically connects the SAW resonator 1 to the ports 11, 12, and 13.

The SAW resonator 1 includes an IDT electrode 15 and reflectors 16, 16 formed on both sides of this IDT electrode 15 in a propagation direction of a surface acoustic wave (hereinafter referred to as "elastic wave"). The IDT electrode 15 includes a pair of busbars 17, 17 and a plurality of electrode fingers 18. The pair of busbars 17, 17 each extend along the propagation direction of the elastic wave, and are disposed so as to separate from one another in a direction perpendicular to the propagation direction of the elastic wave. The plurality of electrode fingers 18 are formed in a comb shape so as to alternately face each other between the busbars 17, 17. The IDT electrode 15 forms a conventional electrode such that the electrode fingers 18 extending from one busbar 17 among the pair of the busbars 17, 17 and the electrode fingers 18 extending adjacently to those electrode fingers 18 from the other busbar 17 are alternately disposed along the propagation direction of the elastic wave. A reference numeral 21 in the drawing denotes a reflector busbar, and a reference numeral 22 denotes a reflector electrode finger. In some cases, the IDT electrode 15, the reflector 16, the routing electrode 14, the respective ports 11, 12, and 13, the reflector busbar 21, and the reflector electrode finger 22 are referred to as an electrode film 23. The electrode film 23 is formed of, for example, Al (aluminum), and formed on a substrate 3.

Figure 2:
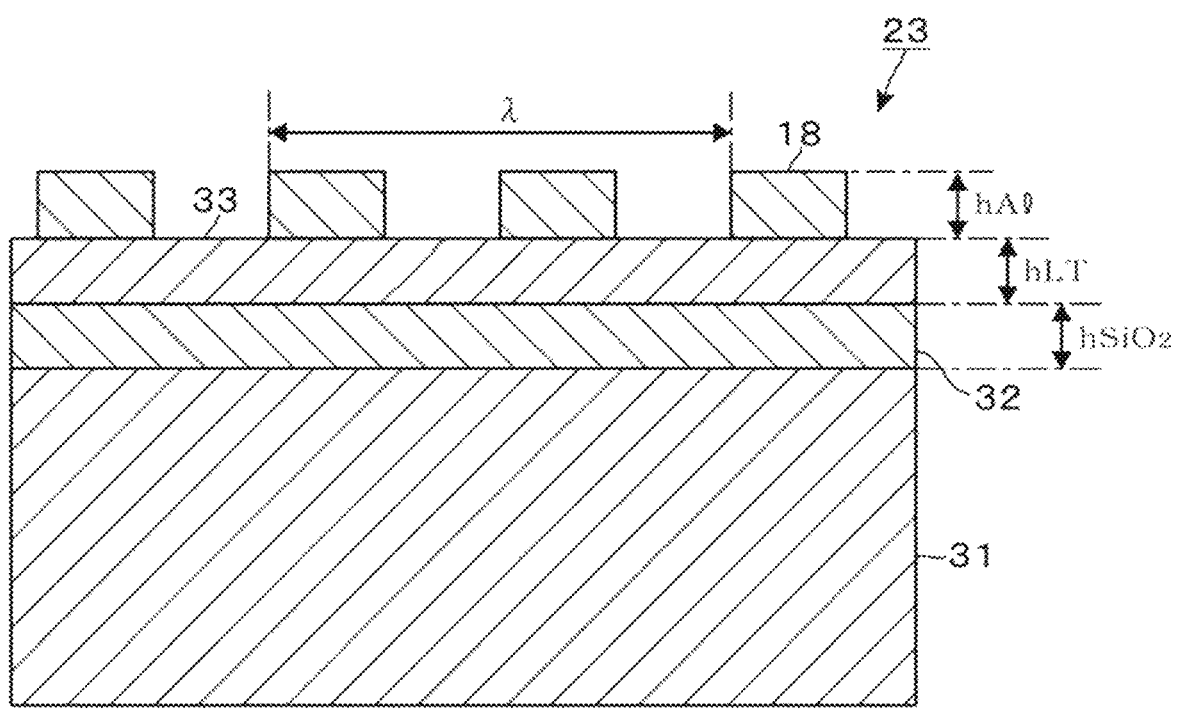
FIG. 2 is a longitudinal sectional side view of the ladder-type filter.

FIG. 2 is a cross-sectional view taken along the line II-II of FIG. 1, and illustrates a longitudinal sectional side view of the electrode finger 18 of the IDT electrode 15 and the substrate 3. As illustrated in FIG. 2, a period length includes respective width dimensions of the mutually adjacent two electrode fingers 18, 18 and separation dimensions between these electrode fingers 18, 18, and the period length corresponds to a frequency of the elastic wave that propagates on the substrate 3. Specifically, the period length has a dimension identical to that of a wavelength λ of the elastic wave in a desired frequency. In this example, a period length λ is configured such that a frequency f of an SH-type surface acoustic wave propagating on a surface of the substrate 3 becomes 2 GHz or more. Specifically, assuming that a velocity of the above-described surface acoustic wave as Vs, f is equal to Vs/λ, thus, for example, 2 is set to 2 μm or less when Vs is 4000 m/second.

The substrate 3 includes a quartz layer 31, an amorphous $SiO_2$ layer 32, and a $LiTaO_3$ (hereinafter described as LT in some cases) layer 33 as a piezoelectric layer (piezoelectric substrate) laminated in this order from the lower side. The above-described electrode film 23 is laminated on the piezoelectric layer 33. In this example, the piezoelectric layer 33 is formed of 36°-rotation Y-cut-X-axis propagation $LiTaO_3$ (36° Y—X LiTaO$_3$). The quartz layer (quartz substrate) 31 is formed of an AT-cut quartz-crystal of 90° X-axis propagation. This is notated as ($\phi$, $\theta$, $\psi$)=(0°, 125.25°, 90°) with Euler angle described later in detail.

As this quartz layer 31, it is only necessary to select a quartz layer having a direction such that the quartz layer is bonded on the piezoelectric layer 33 to reduce the decrease of the Q factor due to the leakage of the energy on the surface of the substrate 3 as a bulk wave, and the quartz layer 31 is not limited to the quartz layer having the above-described Euler angle. Later, a description will be given of an experiment examining a relation between this direction of the quartz layer 31 and the Q factor of the device. While it is considered that the quartz layer 31 has $\phi$=0° and $\theta$=−54.75°, and $\phi$=0° and $\theta$=125.25° when distinguishing front and back of a wafer, both cases are equivalent in property because pf the symmetry of the crystal. Therefore, the case of $\theta$=125.25° is indicated as a representative AT-cut. For the angle $\psi$, a case of $\phi$=0°, $\theta$=−54.75°, $\psi$=90° and a case of $\phi$=0°, $\theta$=54.75°, $\psi$=−90° are equivalent to one another in property because of the symmetry in 180°, and further, the quartz layer 31 including a combination of these symmetries of ($\theta$, $\psi$) has an identical property. That is, the angles $\theta$ and $\psi$ can be selected from the above-described respective values, and the combinations of the angles $\theta$ and $\psi$ can each provide the mutually equivalent property.

The above-described amorphous SiO$_2$ layer 32 is disposed to improve the TCF with the temperature compensation effect. Then, as described with the tests later, it has been confirmed that the adjustment of the thickness of this amorphous SiO$_2$ layer 32 ensures the adjustment of the respective characteristics of the device in addition to the TCF. For obtaining the sufficient temperature compensation effect, the thickness of this amorphous SiO$_2$ layer 32 is, for example, more than 100 nm. Here, the thickness of the amorphous SiO$_2$ layer 32 is not a normalized thickness obtained by dividing by $\lambda$ described below, but the actual thickness of the amorphous SiO$_2$ layer 32.

[First Test]

The first test was performed to examine dependence of the device characteristics on the thicknesses of the piezoelectric layer 33 and the amorphous SiO$_2$ layer 32 such that for a laminated body that included the substrate 3 and the electrode film 23 constituting the electrode finger 18 illustrated in FIG. 2, the thickness of the piezoelectric layer 33 (hLT/$\lambda$) and the thickness of the amorphous SiO$_2$ layer 32 (hSiO$_2$/$\lambda$) were each varied. In this first test through a simulation, $\lambda$=2.1 μm and the electrode film 23 thickness (hAl/$\lambda$)=0.06 were assumed. The value of hLT/$\lambda$ was varied in a range of 0.02 to 1, and hSiO$_2$/$\lambda$ was varied in a range of 0 to 1. FIG. 3 to FIG. 15 illustrate graphs indicating the test result.

Figure 3:
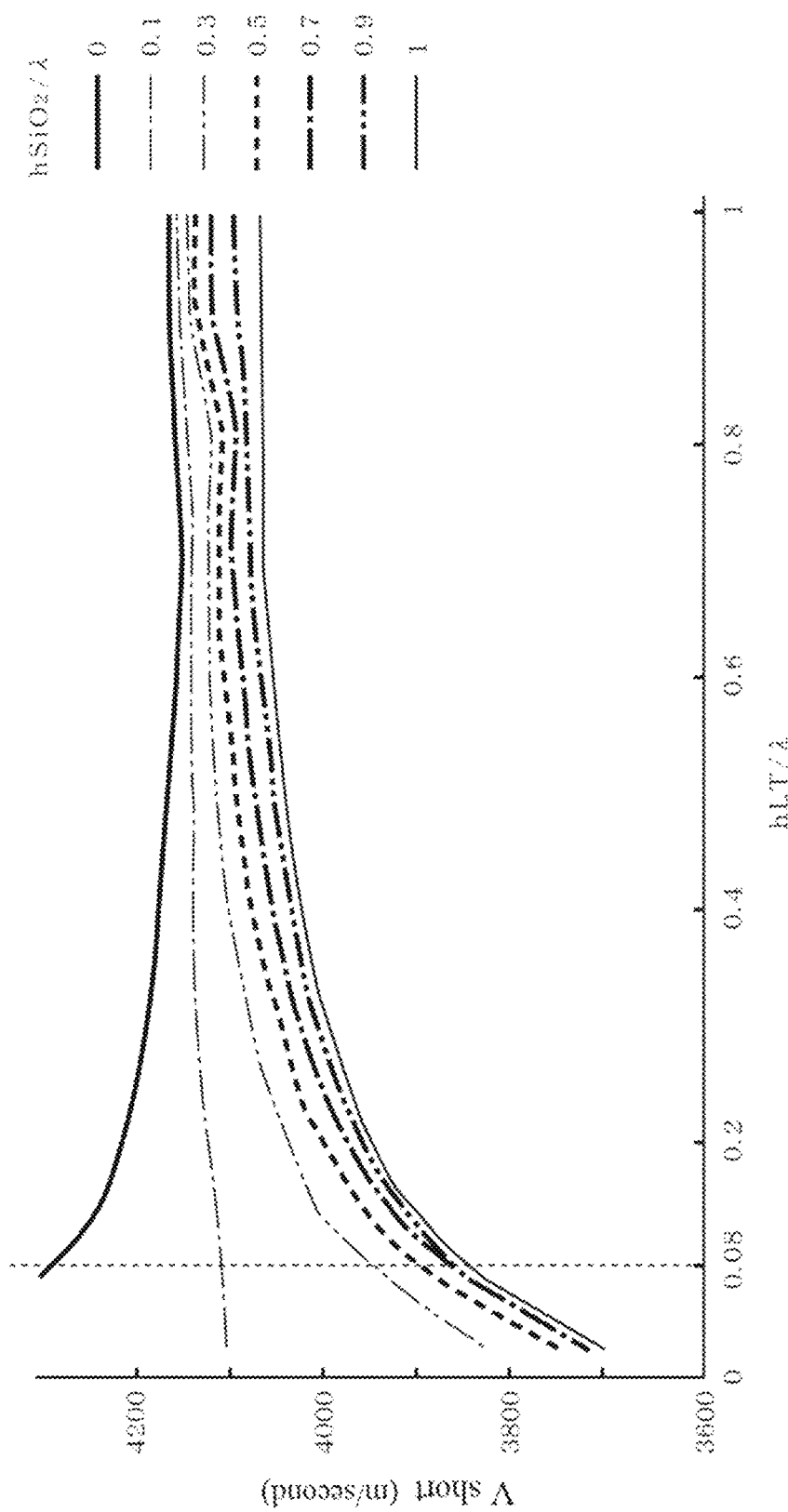
FIG. 3 is a graph illustrating relations between a velocity of SAW and thicknesses of respective layers constituting the SAW device.

The graph of FIG. 3 indicates a relation among an elastic wave propagation velocity Vshort (unit: m/second) when the electrode fingers 18 are mutually short-circuited, hLT/$\lambda$, and hSiO$_2$/$\lambda$. This graph has a vertical axis indicating Vshort and a horizontal axis indicating hLT/$\lambda$, and indicates values of hSiO$_2$/$\lambda$ with lines of mutually different types. While the test was performed with hSiO$_2$/$\lambda$ varied in increments of 0.1 in the above-described range, a part of the hSiO$_2$/$\lambda$ values in the test result are omitted for convenience of illustration. The formula hSiO$_2$/$\lambda$=0 means that the amorphous SiO$_2$ layer 32 is not disposed. The graph of FIG. 4 indicates the relation among the propagation velocity Vopen (unit: m/second) while opening between the electrode fingers 18, 18, hLT/$\lambda$, and hSiO$_2$/$\lambda$. This graph has a vertical axis indicating Vopen and a horizontal axis indicating hLT/$\lambda$, and indicates values of hSiO$_2$/$\lambda$ with lines of respective types similarly to FIG. 3.

Figure 4:
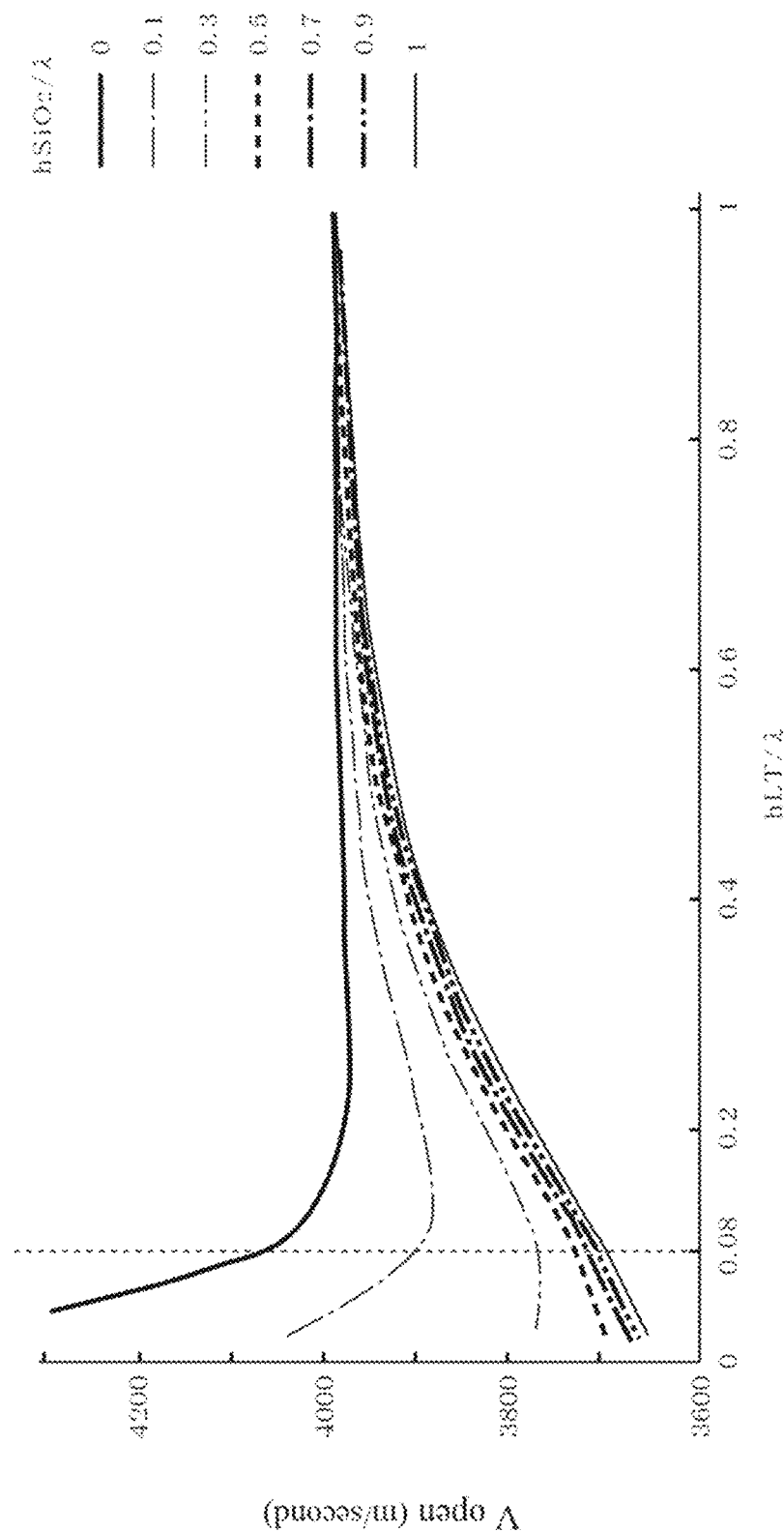
FIG. 4 is a graph illustrating the relations between the velocity of the SAW and the thicknesses of the respective layers constituting the SAW device.

As illustrated in FIG. 3 and FIG. 4, in the case of hSiO$_2$/$\lambda$=0, the values of Vshort and Vopen each decrease as hLT/k increases from the value in the proximity of 0, and the state of decrease becomes slow. In the cases of hSiO$_2$/$\lambda$=0.1 to 1, the values of Vshort and Vopen are each small at hLT/k in the proximity of 0 compared with the case of hSiO$_2$/$\lambda$=0. Then, as hLT/$\lambda$ increases from the proximity of 0, the values of Vshort and Vopen each increase. However, depending on the value of hSiO$_2$/$\lambda$, Vopen once decreases and then increases. Then, as hLT/$\lambda$ increases, the states of increase of Vshort and Vopen become slow. As hLT/k increases, the values of Vshort and Vopen in the cases of hSiO$_2$/$\lambda$=0.1 to 1 each gradually become close to the values of Vshort and Vopen in the case of hSiO$_2$/$\lambda$, =0.

As described above, disposing the amorphous SiO$_2$ layer 32 resulted in the decrease of Vshort and Vopen. Especially, when hLT/$\lambda$ is relatively small, the values of Vshort and Vopen are significantly decreased. Such decrease of Vshort and Vopen ensures reduction of a distance between the electrode fingers 18, 18, thus ensuring downsizing of the SAW device in the identical frequency band. Note that, in the cases of hSiO$_2$/$\lambda$=0.1 to 1 and hLT/$\lambda$≤0.08, inclinations of the respective graphs are relatively steep. That is, slight variation of hLT/$\lambda$ significantly varies the values of Vshort and Vopen. Since manufacturing errors are possibly generated on dimensions of respective units of the device in manufacturing the device, it is required to prevent these errors from significantly influencing on the device characteristics. Therefore, it is considered from the graphs of FIG. 3 and FIG. 4 that hLT/$\lambda$>0.08 is preferable.

Figure 5:
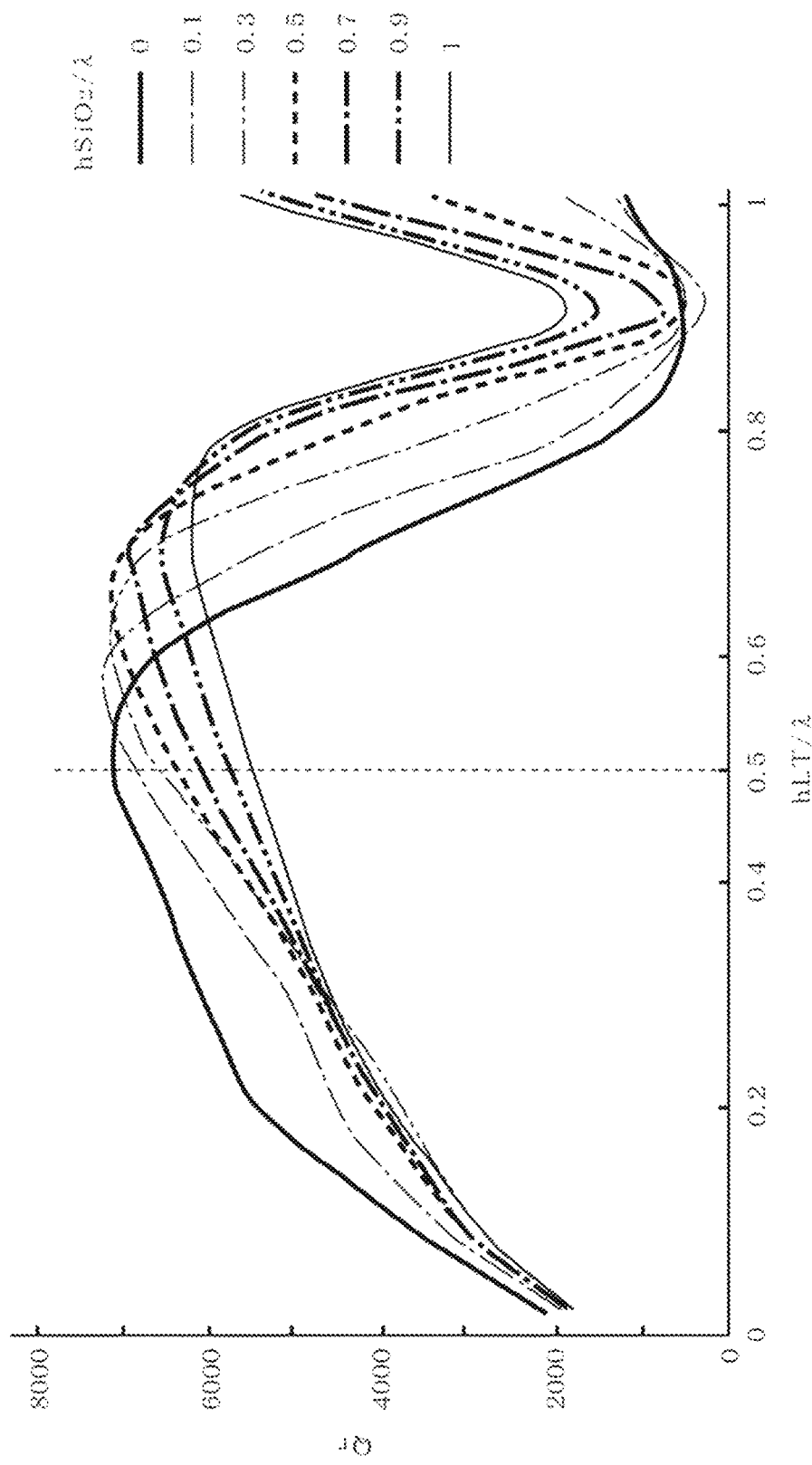
FIG. 5 is a graph illustrating relations between a Q factor and the thicknesses of the respective layers constituting the SAW device.

The graph of FIG. 5 indicates a relation among a Q factor (Qr) at a resonance point, hLT/$\lambda$, and hSiO$_2$/$\lambda$. The graph of FIG. 5 has a vertical axis indicating Qr and a horizontal axis indicating hLT/$\lambda$, and indicates the values of hSiO$_2$/$\lambda$ with lines of respective types similarly to FIG. 3 and FIG. 4. The graph of FIG. 6 indicates a relation among a Q factor (Qa) at an anti-resonance point, hLT/$\lambda$, and hSiO$_2$/$\lambda$. The graph of FIG. 6 has a vertical axis indicating Qa and a horizontal axis indicating hLT/$\lambda$, and indicates the values of hSiO$_2$/$\lambda$ with lines of respective types similarly to FIG. 5.

Figure 6:
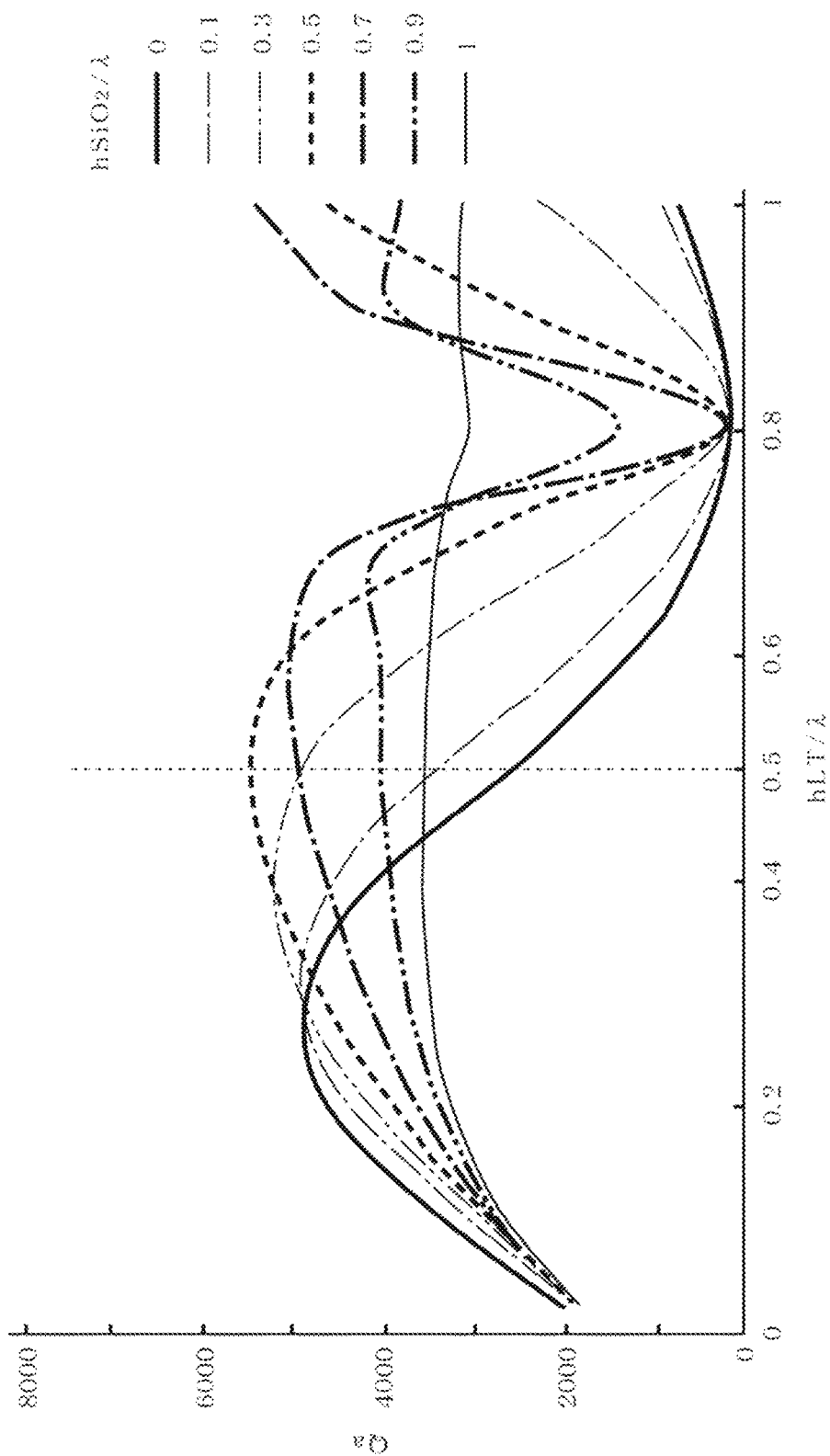
FIG. 6 is a graph illustrating the relations between the Q factor and the thicknesses of the respective layers constituting the SAW device.

An outline of variation of Qr in the graph of FIG. 5 is that, for the respective values of hSiO$_2$/$\lambda$=0 to 1, Qr increases as hLT/$\lambda$ increases from a value in the proximity of 0, and after that, Qr rapidly decreases. At inflection points in the graph where Qr decreases after the increase, the values of hLT/$\lambda$ are higher in the cases of hSiO$_2$/$\lambda$=0.1 to 1 compared with the case of hSiO$_2$/$\lambda$=0. An outline of variation of Qa in the graph of FIG. 6 is that, for the respective values of hSiO$_2$/$\lambda$=0 to 0.9, Qa increases as hLT/$\lambda$ increases from a value in the proximity of 0, and after that, Qa decreases. At inflection points in the graph where Qa decreases after the increase, the values of hLT/$\lambda$ are higher in the cases of hSiO$_2$/$\lambda$=0.1 to 0.9 compared with the case of hSiO$_2$/$\lambda$=0. In the case of hSiO$_2$/$\lambda$=1, after Qa increases as hLT/$\lambda$ increases from a value in the proximity of 0, the increase stops, and Qa remains mostly constant. From this result, having 0.1≤hSiO$_2$/$\lambda$≤1 ensures narrowing or eliminating the range where Qr and Qa decrease with the increase of hLT/$\lambda$ in the range of hLT/$\lambda$≤1, thus ensuring enhancing a degree of freedom for the setting of hLT/$\lambda$.

Figure 7:
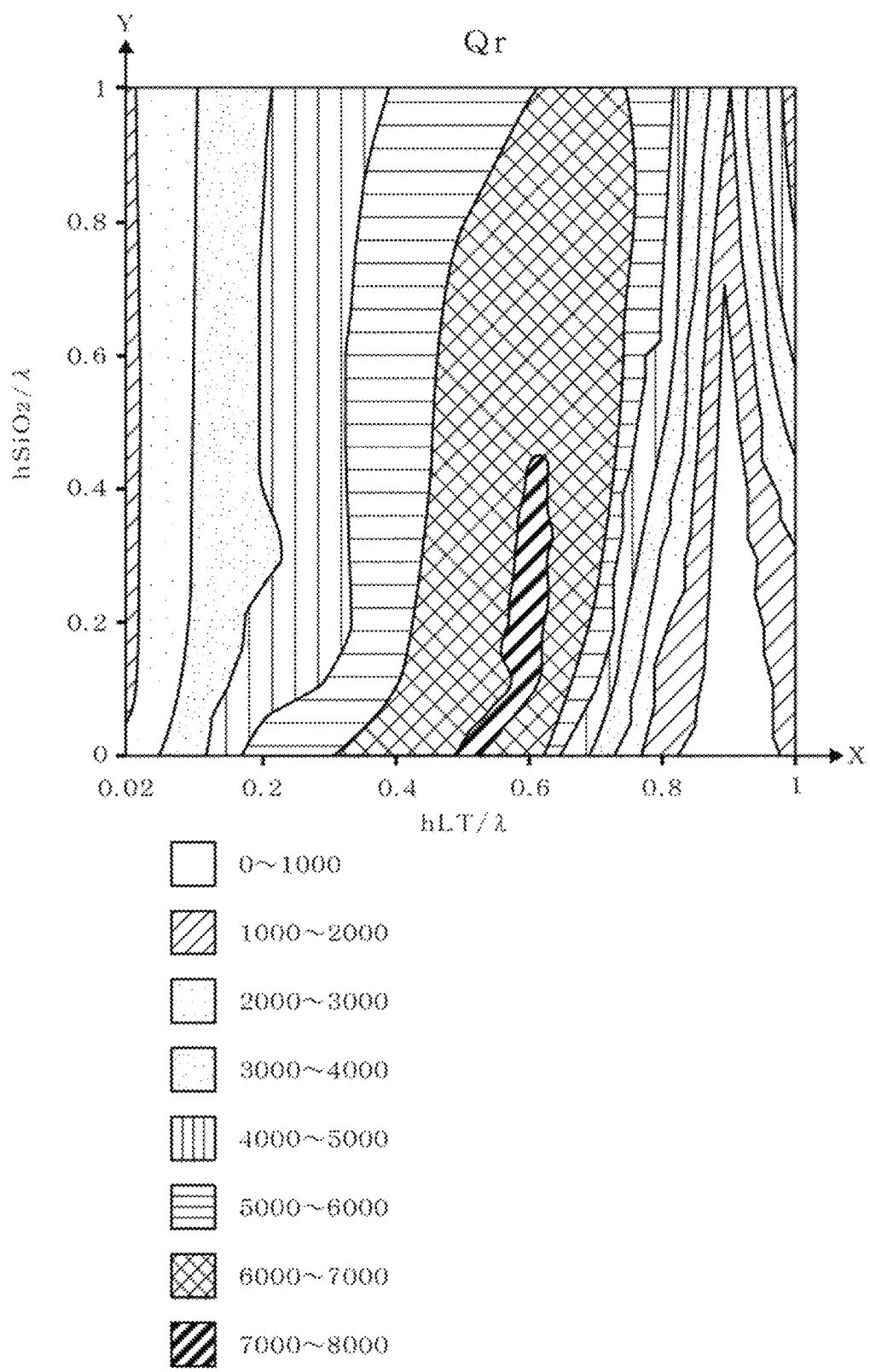
FIG. 7 is a contour plan illustrating the relations between the Q factor and the thicknesses of the respective layers constituting the SAW device.
Figure 8:
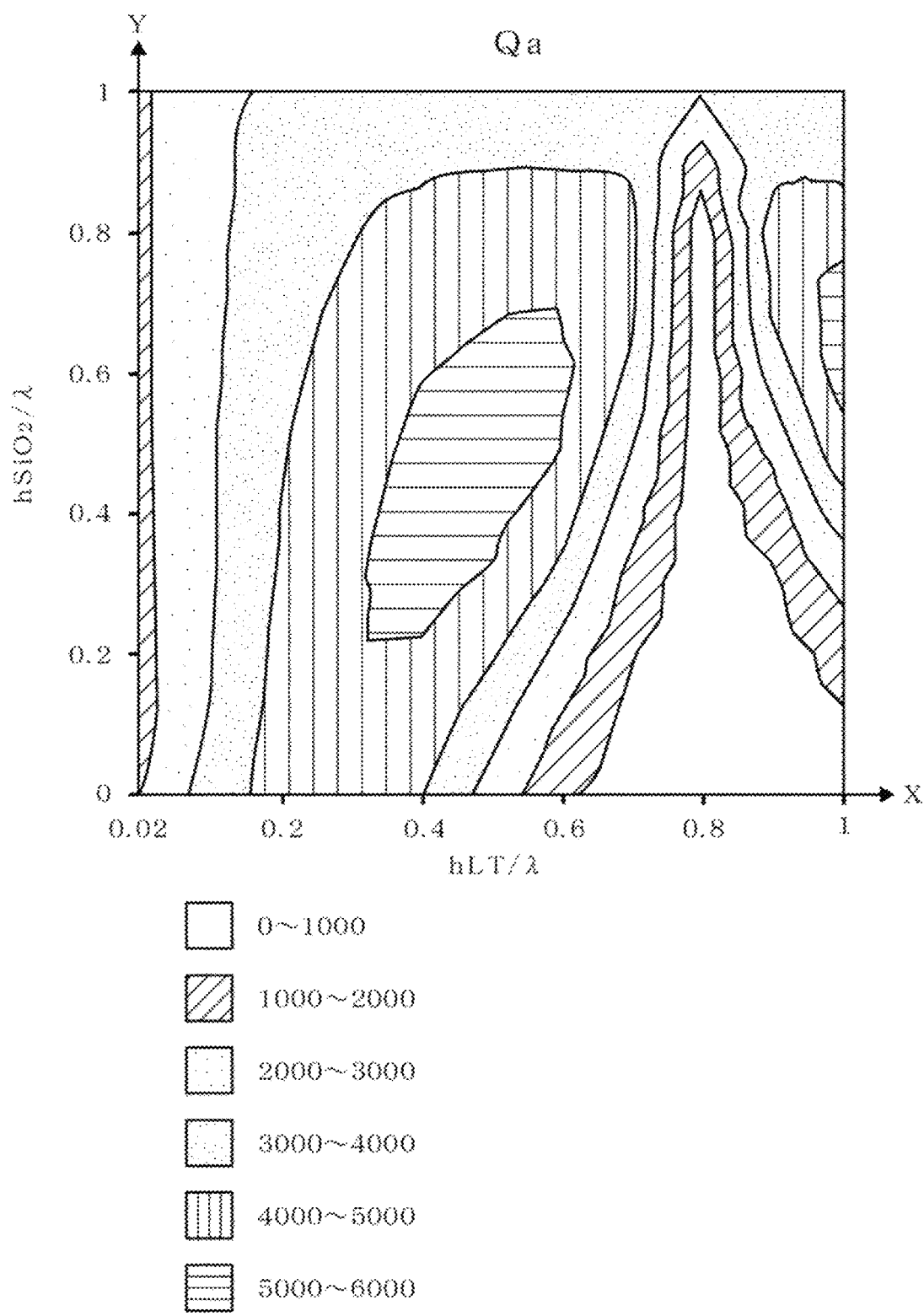
FIG. 8 is a contour plan illustrating the relations between the Q factor and the thicknesses of the respective layers constituting the SAW device.

FIG. 7 indicates the relation among Qr, hLT/$\lambda$, and hSiO$_2$/$\lambda$ in an aspect different from FIG. 5. FIG. 8 indicates the relation among Qa, hLT/$\lambda$, and hSiO$_2$/$\lambda$ in an aspect different from FIG. 6. FIG. 7 and FIG. 8 each have an X-axis indicating hLT/λ and a Y-axis indicating hSiO$_2$/λ, and each illustrate distribution of the Q factor (Qr or Qa) with contour lines. For distinction of the ranges of the Q factor of respective regions enclosed by the contour lines, the respective regions are patterned correspond to the ranges of the Q factor.

For the use as the SAW device in the frequency band of 2 GHz or more, Q factor>1000 is practically required. FIG. 5 to FIG. 8 show that the region where Qr or Qa has very high value of 5000 to 6000 exists in a range of hLT/λ<0.8, thus it is considered to be preferable to set hLT/λ in such a range. It is seen that there is a region where both Qr and Qa have very high values of 5000 to 6000 at hLT/λ<0.5. Accordingly, it is seen that setting hLT/λ<0.5 is especially preferable for obtaining the sufficient Q factor. The reason why the substrate 3 is configured by laminating the piezoelectric layer 33 and the quartz layer 31 is that the characteristics are more improved compared with the case where the substrate is configured with only one of these layers. However, too large hLT/λ causes the characteristic of the piezoelectric layer 33 to be dominant, thus reducing the effect of laminating the layers. From an aspect of preventing this, it is preferred to set hLT/λ in a relatively small range such as hLT/λ<0.5.

Figure 9:
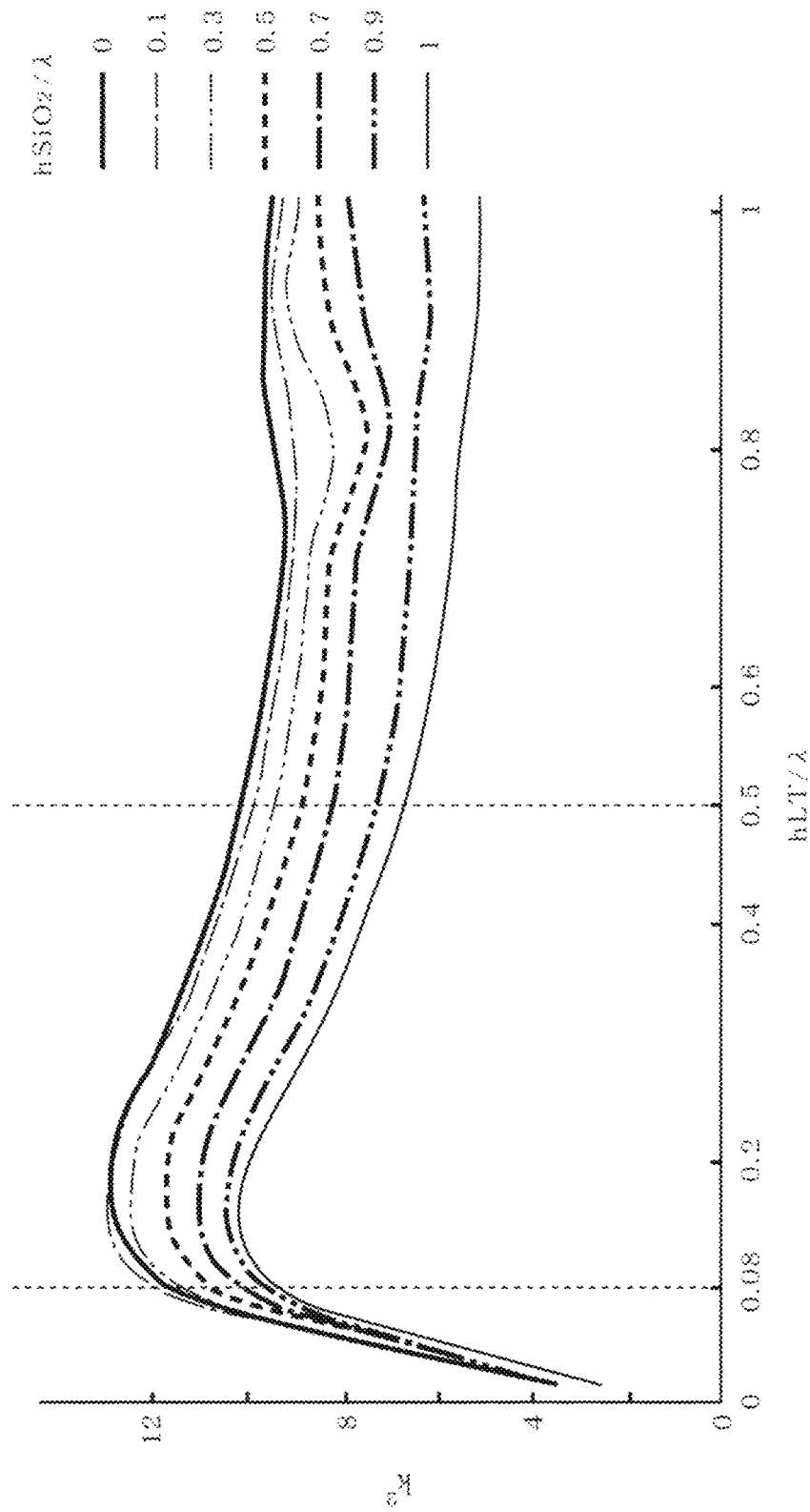
FIG. 9 is a graph illustrating relations between an electromechanical coupling coefficient and the thicknesses of the respective layers constituting the SAW device.

The graph of FIG. 9 indicates a relation among an electromechanical coupling coefficient k$^2$ (unit: %), hLT/λ, and hSiO$_2$/λ. The graph has a vertical axis and a horizontal axis indicating k$^2$ and hLT/λ, respectively, and indicates the values of hSiO$_2$/λ with lines of mutually different types similarly to FIG. 3 and similar drawing. The above-described k$^2$ is calculated with Formula 1 below. In the formula, fr is a frequency at the resonance point, and fa is a frequency at the anti-resonance point.

$$k^2 = (\pi/2 \cdot fr/fa)/\tan(\pi/2 \cdot fr/fa) \quad \text{Formula 1}$$

Respective waveforms of hSiO$_2$/λ in the graph show that the k$^2$ rapidly increases as hLT/λ increases from the proximity of 0, the increase stops, and then, the k$^2$ slowly decreases. The graphs of hSiO$_2$/λ=0.2, 0.4, 0.6, and 0.8, which are not illustrated in FIG. 9, also indicate such variation. At hSiO$_2$/λ=0.1, the k$^2$ had the maximum value of 13.13%.

This k$^2$ has an appropriate value corresponding to equipment to which the SAW device is installed. However, a high value is typically preferred because of high versatility. Furthermore, considering the error generated in manufacturing the device as described above, it is preferred that variation amount of the value of the k$^2$ is small with respect to variation amount of hLT/λ. For example, it can be confirmed from the graph of FIG. 9 that practically effective k$^2$ of approximately 8% or more is obtained and the variation amount of the value of the k$^2$ is relatively low with respect to the variation amount of hLT/λ at 0.08<hLT/λ<0.5 and hSiO$_2$/λ<0.5. Therefore, preferably, hLT/λ and hSiO$_2$/λ are set in such ranges.

Figure 10:
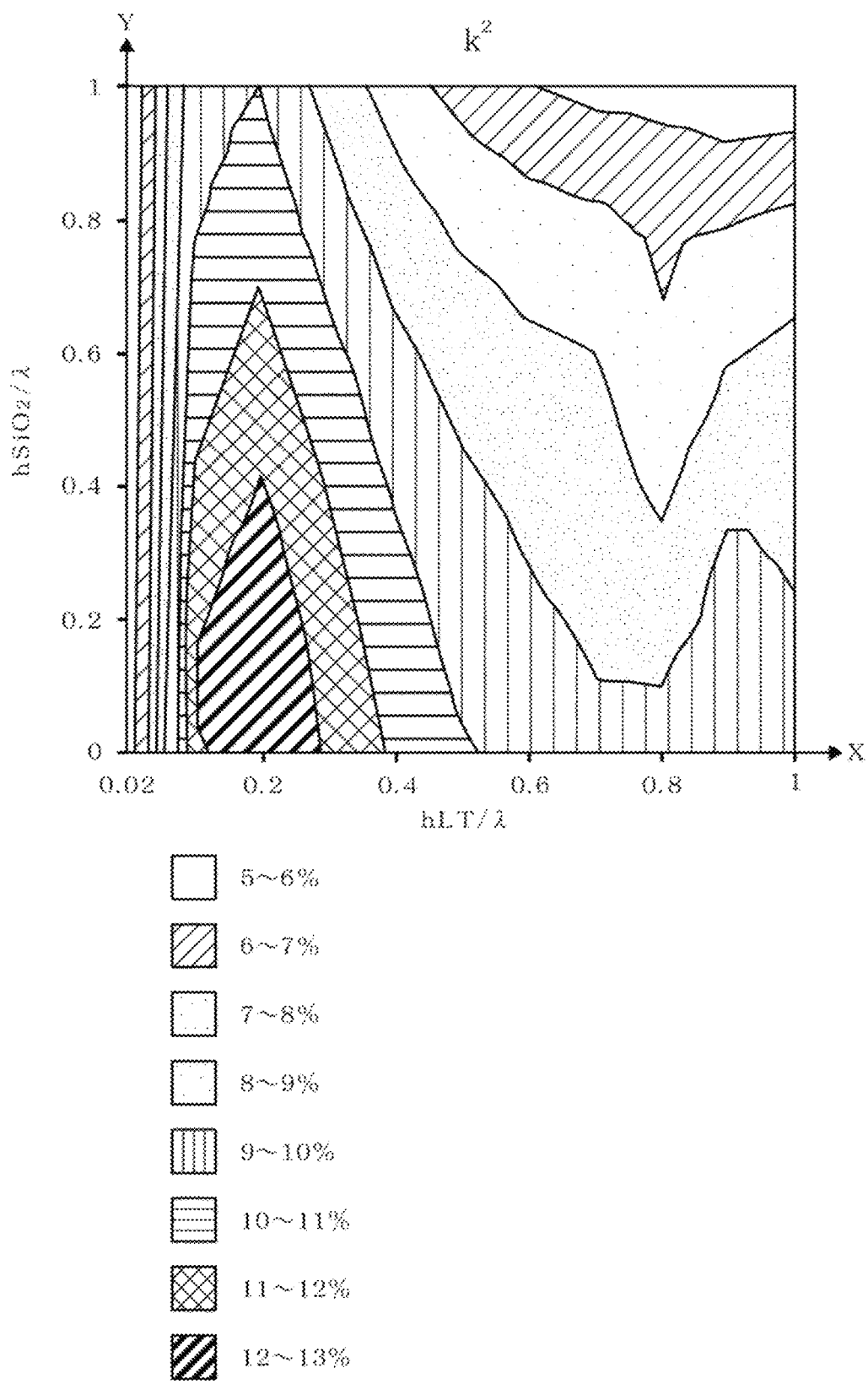
FIG. 10 is a contour plan illustrating the relations between the electromechanical coupling coefficient and the thicknesses of the respective layers constituting the SAW device.

FIG. 10 indicates the relation among hLT/λ, hSiO$_2$/λ, and the k$^2$ obtained through the test as a contour plan. FIG. 10 has an X-axis indicating hLT/λ and a Y-axis indicating hSiO$_2$/λ similarly to FIG. 8, and illustrates distribution of the k$^2$ with contour lines. As illustrated in FIG. 10, there is a region where the k$^2$ has very high values of 12 to 13% in a range of 0.1≤hSiO$_2$/λ≤0.3. Accordingly, it is especially preferred to set 0.1≤hSiO$_2$/λ≤0.3 for increasing the k$^2$ of the SAW device.

The graph of FIG. 11 indicates a relation among the TCF (unit: ppm/° C.) at the resonance point, hLT/λ, and hSiO$_2$/λ, and has a vertical axis indicating this TCF at the resonance point (hereinafter described as TCF-fr) and a horizontal axis indicating hLT/λ. The graph of FIG. 12 indicates a relation among the TCF (unit: ppm/° C.) at the anti-resonance point, hLT/λ, and hSiO$_2$/λ, and has a vertical axis indicating this TCF at the anti-resonance point (hereinafter described as TCF-fa) and a horizontal axis indicating hLT/λ. These graphs of FIG. 11 and FIG. 12 indicate the values of hSiO$_2$/λ with lines of mutually different types similarly to the graphs of FIG. 3 and FIG. 4. TCF-fr and TCF-fa closer to 0 ppm/° C. are more preferable.

Figure 11:
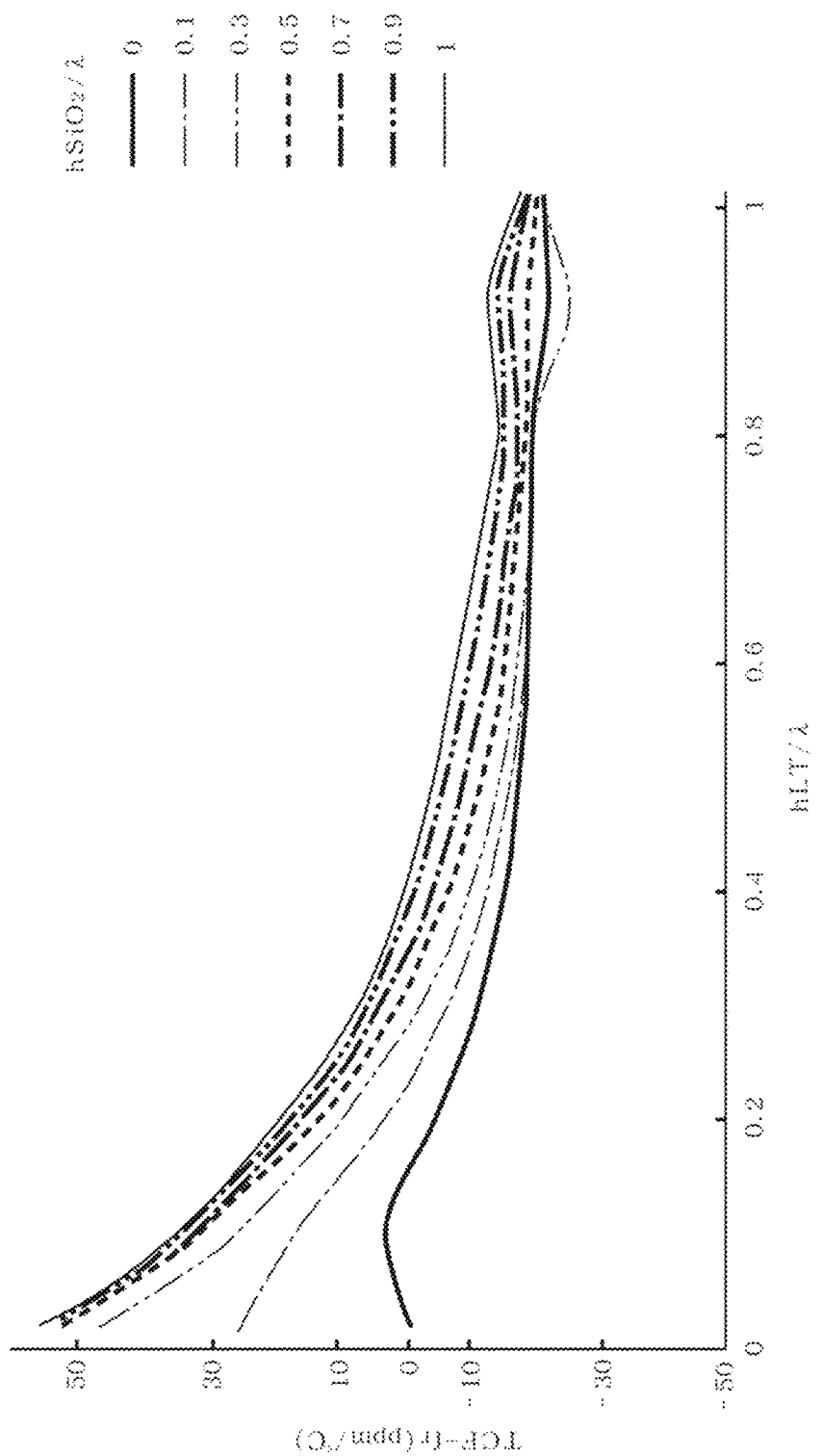
FIG. 11 is a graph illustrating relations between a TCF and the thicknesses of the respective layers constituting the SAW device.

FIG. 11 shows that, in the case of hSiO$_2$/λ=0, TCF-fr increases as hLT/λ increases from the proximity of 0, and after hLT/λ becomes approximately 0.1, this TCF-fr slowly decreases. Then, TCF-fr=0 ppm is obtained in a range of relatively low hLT/λ. Meanwhile, in the cases of hSiO$_2$/λ, =0.1 to 1, TCF-fr is equal to or more than 0 ppm/° C. at hLT/λ in the proximity of 0, and TCF-fr decreases as hLT/λ increases from the proximity of 0 and becomes TCF-fr=0 ppm/° C. before hLT/λ becomes 0.4. With the further increase of hLT/λ, the values of TCF-fr in the cases of hSiO$_2$/λ=0.1 to 1 gradually become close to the value of TCF-fr in the case of hSiO$_2$/λ=0. When this hLT/λ has any value at 0.8>hLT/λ, the value of TCF-fr increases as the value of hSiO$_2$/λ, increases.

Figure 12:
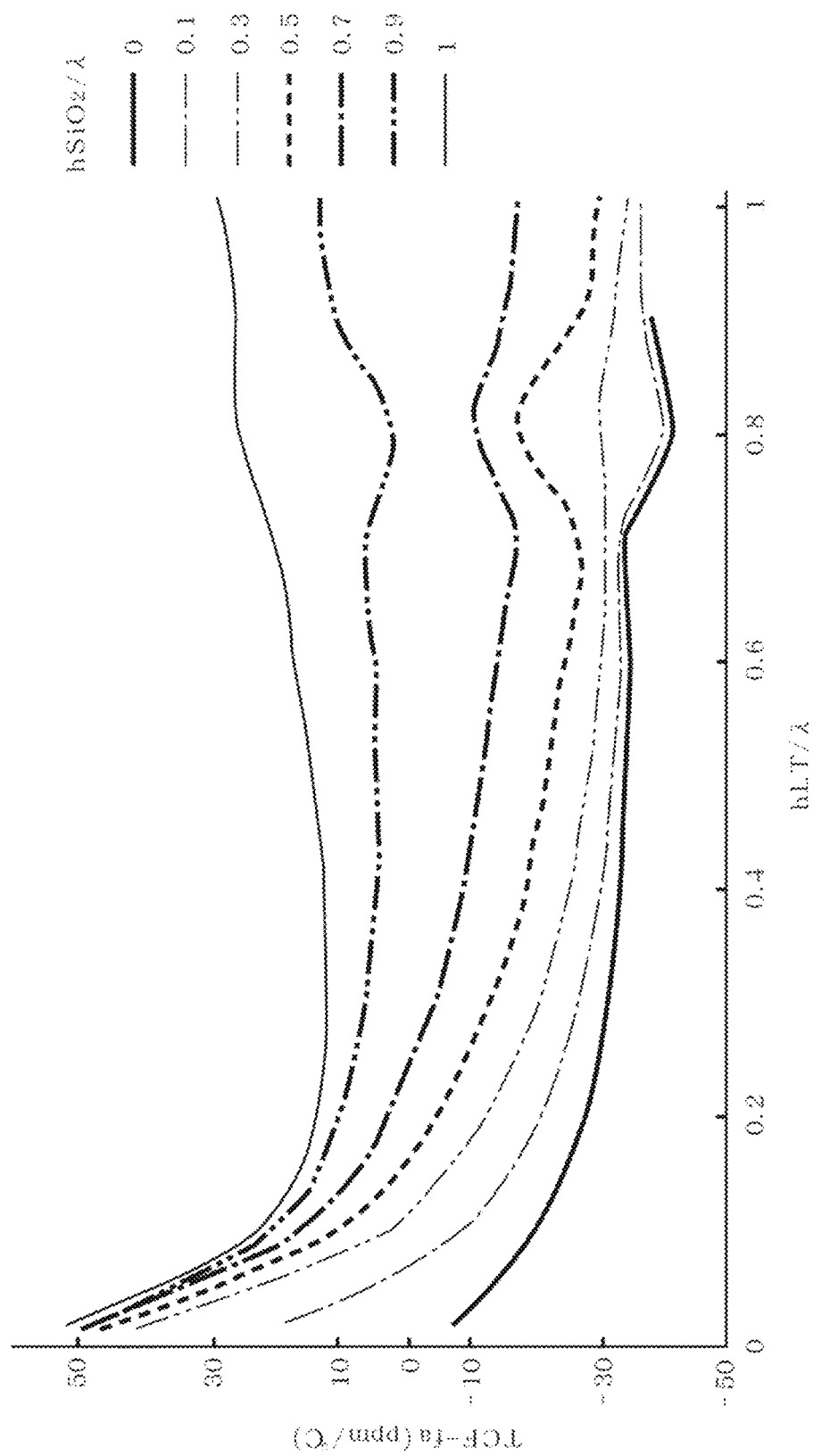
FIG. 12 is a graph illustrating the relations between the TCF and the thicknesses of the respective layers constituting the SAW device.

FIG. 12 shows that, in the case of hSiO$_2$/λ=0, TCF-fa gradually decreases as hLT/λ increases from the proximity of 0. Then, at hLT/λ in the proximity of 0, TCF-fa is closest to 0 ppm/° C. while having the value lower than this 0 ppm/° C. Meanwhile, in the cases of hSiO$_2$/λ=0.1 to 1, TCF-fa is higher than 0 ppm/° C. at hLT/λ in the proximity of 0, and TCF-fa rapidly decreases as this hLT/λ increases from the proximity of 0, subsequently slowly decreases. In the middle of such slow decrease, the values of TCF-fa in the cases of hSiO$_2$/λ=0.1 to 0.8 become equal to or less than 0 ppm/° C. in a range of hLT/λ=0.08 to 0.3. TCF-fa in the case of hSiO$_2$/λ=0.9 slowly decreases as described above, and gradually becomes close to 0 ppm/° C. at hLT/λ=0.4 to 0.6. In the case of hSiO$_2$/λ=1, TCF-fa slowly decreases as described above, and then, slowly increases. In each range of hLT/λ, excluding the proximity of hLT/λ, =0.8, the values of TCF-fa increase as the values of hSiO$_2$/λ, increase.

The graph of FIG. 11 has shown that having 0.1≤hSiO$_2$/λ≤1 ensures the increased hLT/λ, value where TCF-fr becomes 0 ppm/° C. compared with the case of hSiO$_2$/λ=0. The graph of FIG. 12 has shown that having 0.1≤hSiO$_2$/λ≤1 ensures the increased hLT/λ, value where TCF-fa becomes 0 ppm/° C. or the proximity of 0 ppm/° C. compared with the case of hSiO$_2$/λ=0. Too small hLT/λ, value causes difficulty in forming the piezoelectric layer 33 in the manufacturing process of the wafer for the SAW in some cases. Accordingly, it has been confirmed that having 0.1≤hSiO$_2$/λ≤1 provides a sufficient temperature characteristic for the SAW device and ensures facilitated manufacturing.

The following describes the reason why the above-described small hLT/λ, value causes difficulty in forming the piezoelectric layer 33 in detail. Since λ becomes about 2 μm or less at 2 GHz or more, the actual dimension (=hLT) of the thickness of the piezoelectric layer 33 is extremely decreased, and a significant problem arises in ΔhLT/hLT (ΔhLT is an error of hLT) as its dispersion. The even a little bit larger hLT/λ is, the more the influence of the above-described dispersion (ΔhLT/hLT) on the characteristics is reduced. The following trial calculation makes this clearer. In the case of λ=2 μm, ΔhLT=0.01 μm, and hSiO$_2$=0, TCF-fr=0 is satisfied at hLT=0.08λ=0.16 μm from the graph of FIG. 11, and therefore, ΔhLT/hLT=0.01/0.16 is obtained. Meanwhile, in the case of hSiO$_2$=0.1, TCF-fr=0 is satisfied at hLT=0.18λ=0.36 μm, and therefore, ΔhLT/hLT=0.01/0.36 is obtained, thus ensuring the reduction of the thickness dispersion.

The graphs of FIG. 11 and FIG. 12 each show that the temperature compensation effect is obtained such that the larger $hSiO_2/\lambda$ is, the higher the values of TCF-fr and TCF-fa are shifted. Especially, TCF-fa has large amount of this shift due to the addition of the amorphous $SiO_2$ layer 32. Now, FIG. 12 shows that a difference between the value of TCF-fa at any hLT/λ value and 0 ppm/° C. is slightly large in the case of $hSiO_2/\lambda=1$. Then, setting $hSiO_2/\lambda$ to more than 1 is considered to be inappropriate. Therefore, it is effective to set to $0 \leq hSiO_2/\lambda \leq 1$ for obtaining the appropriate value of the TCF.

Figure 13:
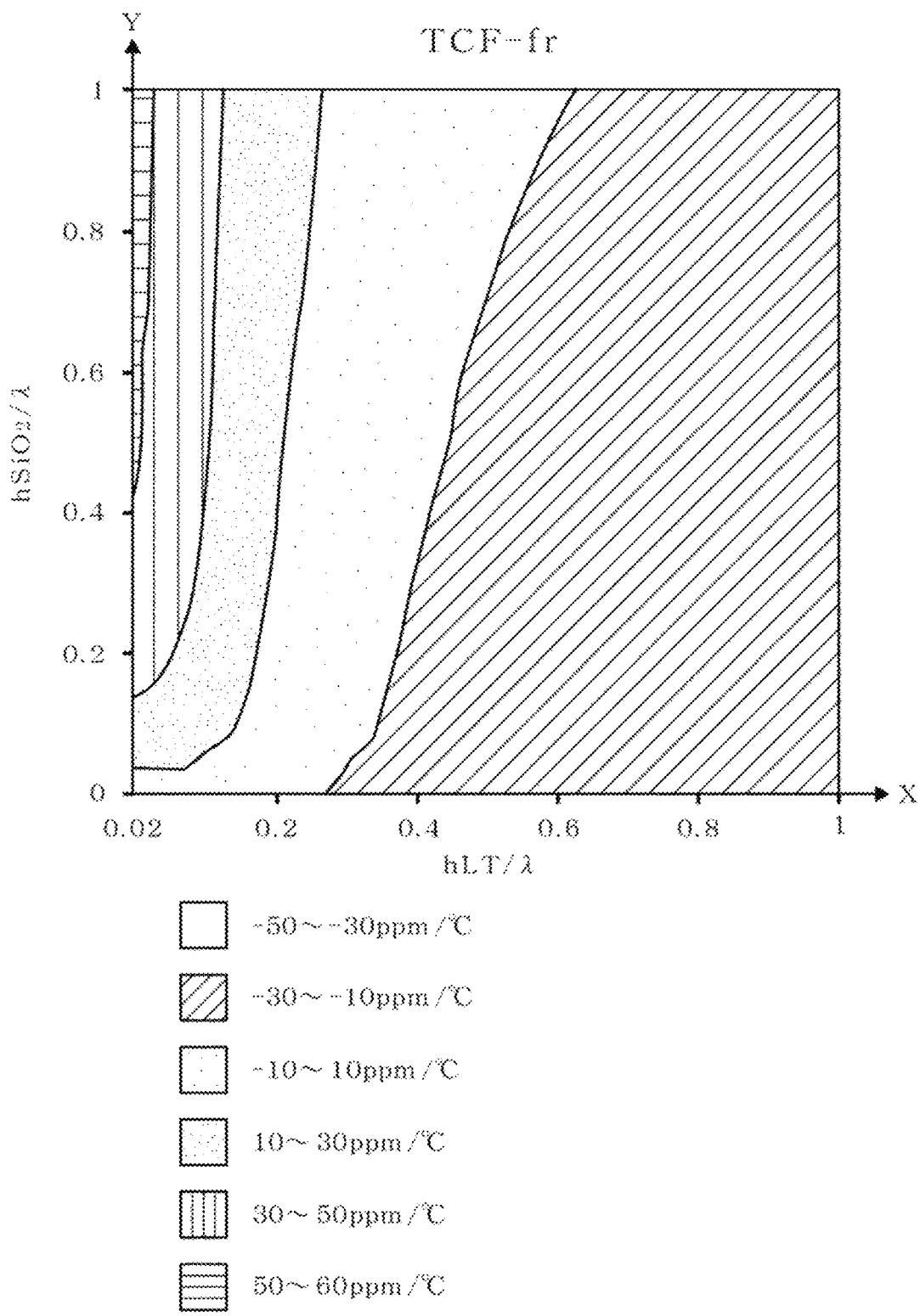
FIG. 13 is a contour plan illustrating the relations between the TCF and the thicknesses of the respective layers constituting the SAW device.

The contour plan of FIG. 13 indicates the relation among hLT/λ, $hSiO_2/\lambda$, and TCF-fr, similarly to that of FIG. 11. The contour plan of FIG. 14 indicates the relation among hLT/λ, $hSiO_2/\lambda$, and TCF-fa, similarly to that of FIG. 12. These contour plans of FIG. 13 and FIG. 14 each have an X-axis indicating hLT/λ, and a Y-axis indicating $hSiO_2/\lambda$. The contour plans of FIG. 13 and FIG. 14 each indicate the distribution of the TCF by drawing the contour lines corresponding to the TCF (TCF-fr or TCF-fa) and patterning the respective regions enclosed by the contour lines, similarly to FIG. 7 and similar drawing.

Figure 14:
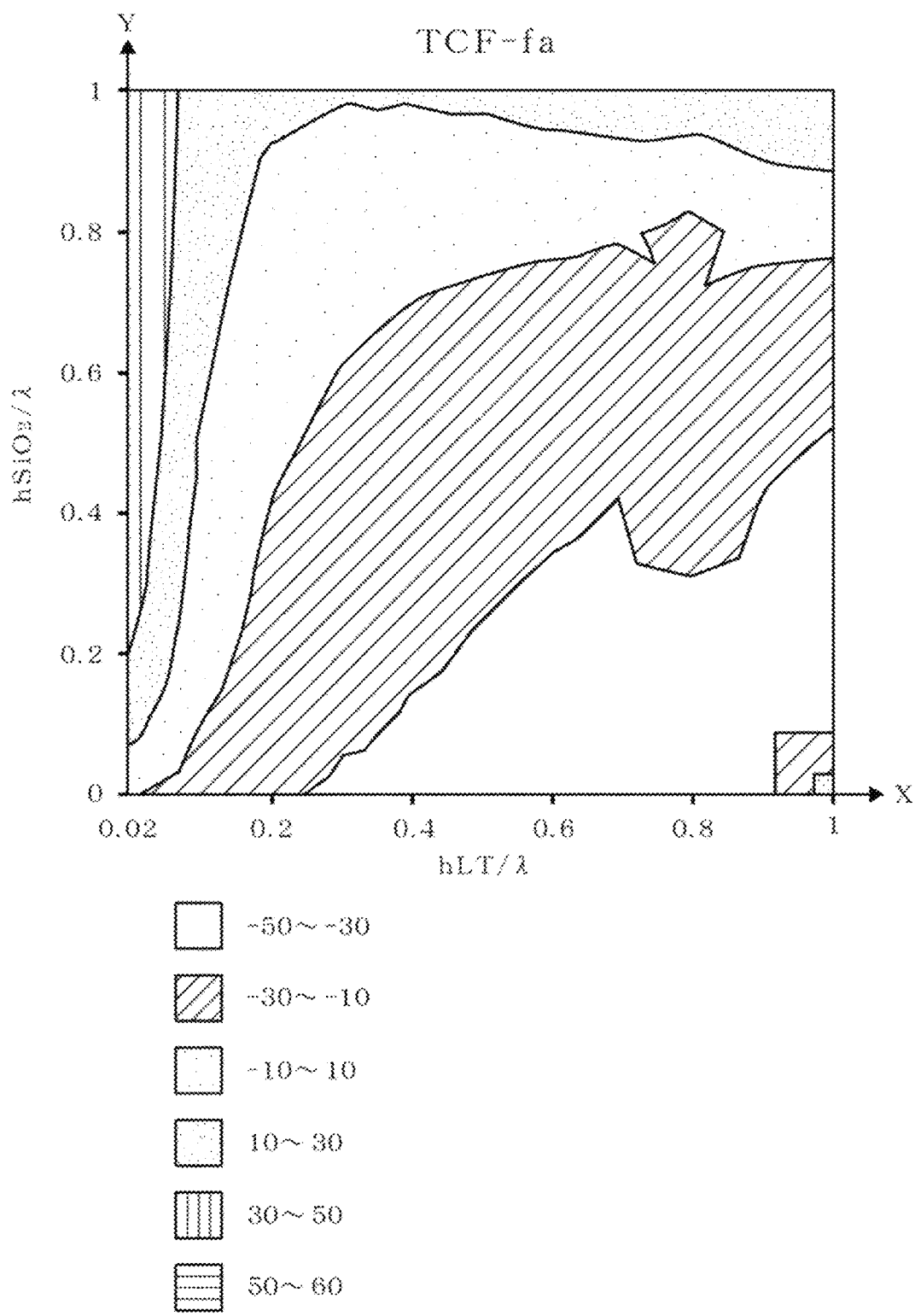
FIG. 14 is a contour plan illustrating the relations between the TCF and the thicknesses of the respective layers constituting the SAW device.

In the contour plans of FIG. 13 and FIG. 14, for the ranges of $hSiO_2/\lambda$ of the regions where TCF-fr and TCF-fa are −10 ppm/° C. to +10 ppm/° C., these ranges of $hSiO_2/\lambda$ are narrow in the ranges where hLT/λ is relatively small. However, when hLT/λ is relatively thick, specifically, hLT/λ≥0.2, these ranges of $hSiO_2/\lambda$ become wide, thus it is seen that hLT/λ≥0.2 is preferable.

Figure 15:
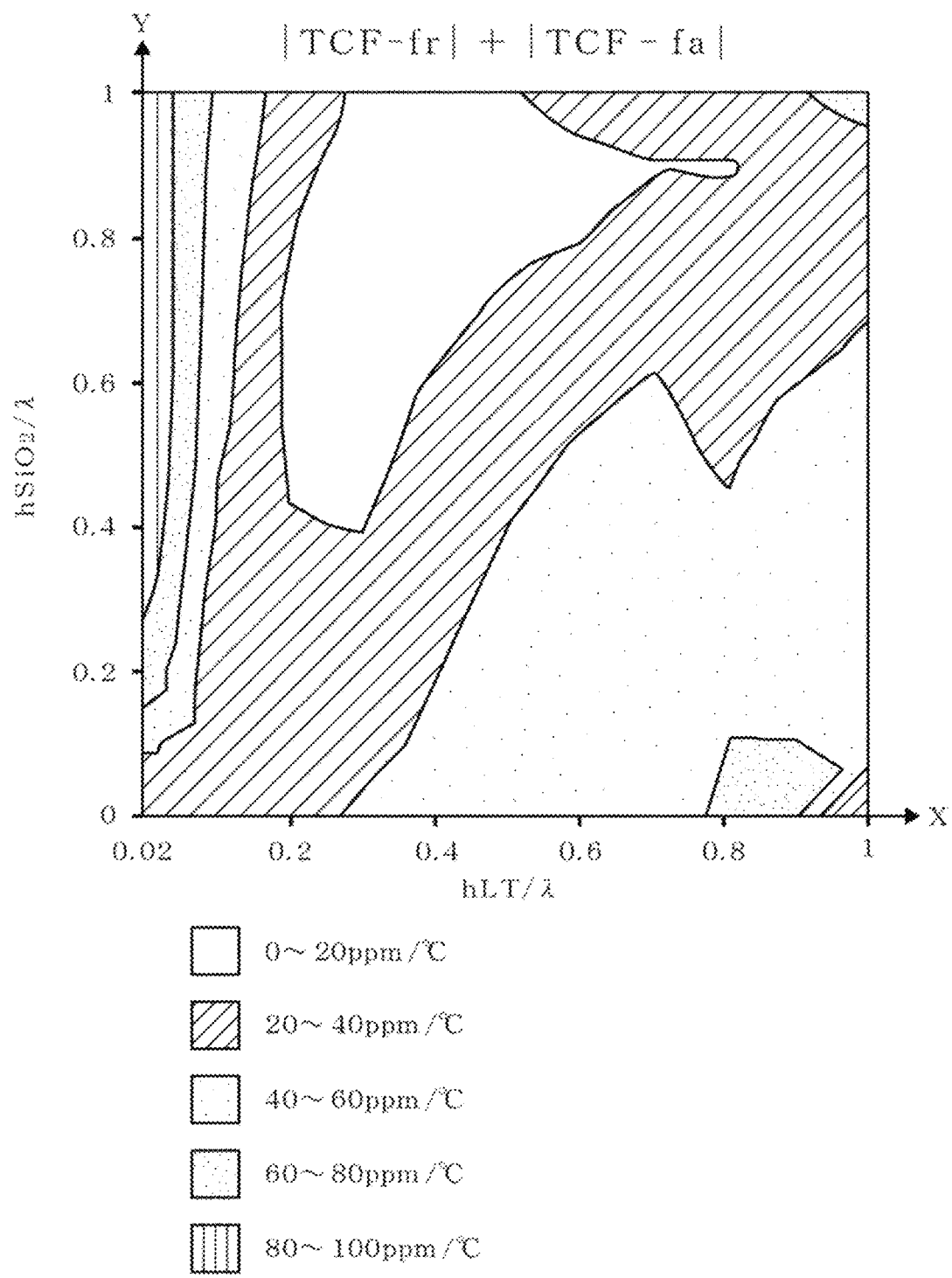
FIG. 15 is a contour plan illustrating the relations between the TCF and the thicknesses of the respective layers constituting the SAW device.

FIG. 15 is a contour plan indicating the relation among hLT/λ, $hSiO_2/\lambda$, and |TCF-fr|+|TCF-fa|. The contour plan has an X-axis indicating hLT/λ and a Y-axis indicating $hSiO_2/\lambda$, and the contour lines are drawn corresponding to |TCF-fr|+|TCF-fa|. As illustrated in FIG. 15, there is a region where a value of |TCF-fr|+|TCF-fa| is considerably low at 0 to 20 ppm in a range of 0.2≤hLT/λ≤0.7 and $0.4 \leq hSiO_2/\lambda \leq 1$. Accordingly, for obtaining the sufficient frequency versus temperature characteristic, hLT/λ and $hSiO_2/\lambda$ are preferred to be set to such a range.

Figure 16:
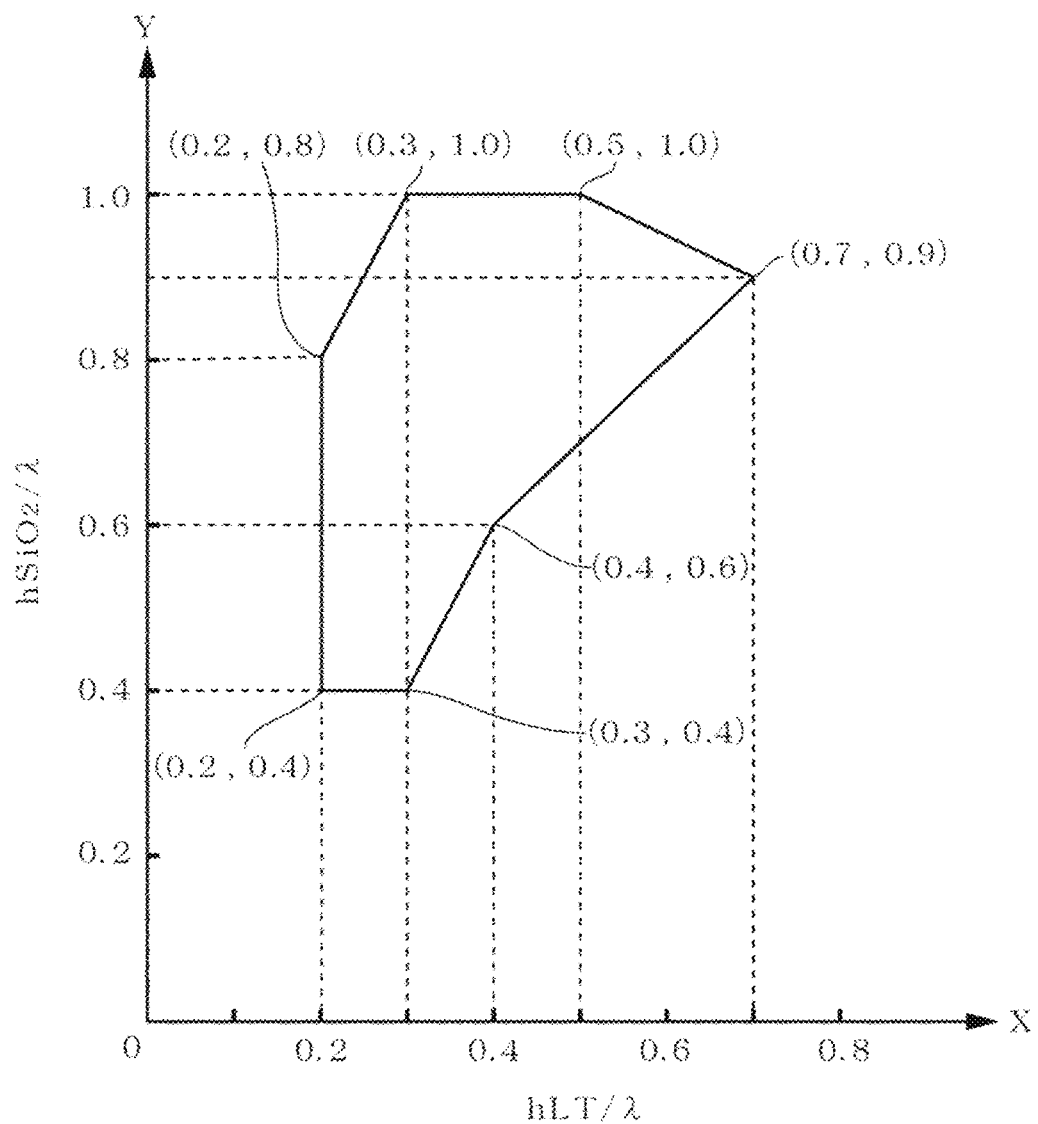
FIG. 16 is a schematic diagram illustrating the relations between the TCF and the thicknesses of the respective layers constituting the SAW device.

The region where |TCF-fr|+|TCF-fa|=0 to 20 ppm is thus satisfied approximates a heptagon as illustrated in FIG. 16. This heptagon is a region enclosed by respective line segments having: X=0.2 in a range of Y=0.4 to 0.8; Y=0.4 in a range of X=0.2 to 0.3; Y=2X−0.2 in a range of X=0.3 to 0.4; Y=X+0.2 in a range of X=0.4 to 0.7; Y=−0.5X+1.25 in a range of X=0.5 to 0.7; Y=1 in a range of X=0.3 to 0.5; and Y=2X+0.4 in a range of X=0.2 to 0.3. That is, when the graph has a horizontal axis (X-axis) indicating hLT/λ and a vertical axis (Y-axis) indicating $hSiO_2/\lambda$, coordinates (hLT/λ, $hSiO_2/\lambda$) of apexes of the above-described heptagon are (0.2, 0.4), (0.3, 0.4), (0.4, 0.6), (0.7, 0.9), (0.5, 1.0), (0.3, 1.0), and (0.2, 0.8). It is especially preferable to set respective hLT/λ and $hSiO_2/\lambda$ to the values within the region of this heptagon.

Figure 17:
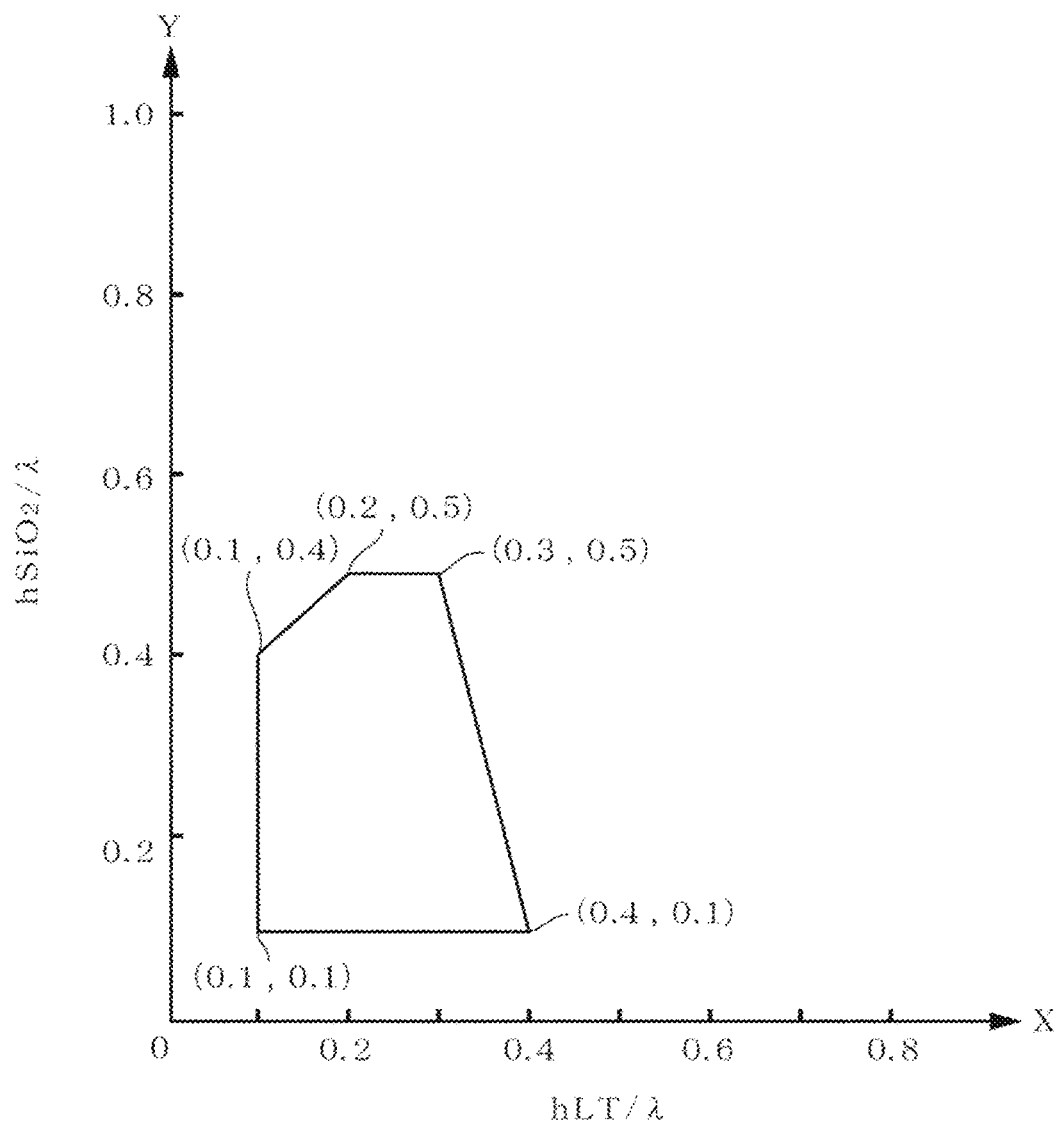
FIG. 17 is a schematic diagram illustrating the relations between the TCF and the thicknesses of the respective layers constituting the SAW device.
Figure 18A:
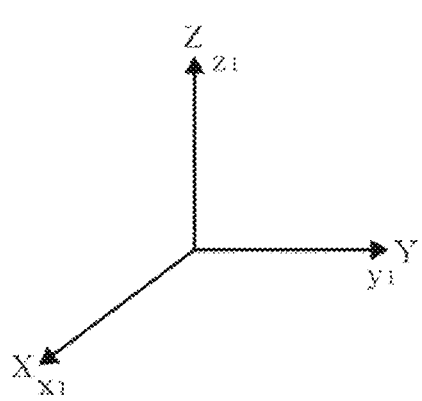
FIG. 18A to FIG. 18D are schematic diagrams for describing a notation with Euler angle.
Figure 18B:
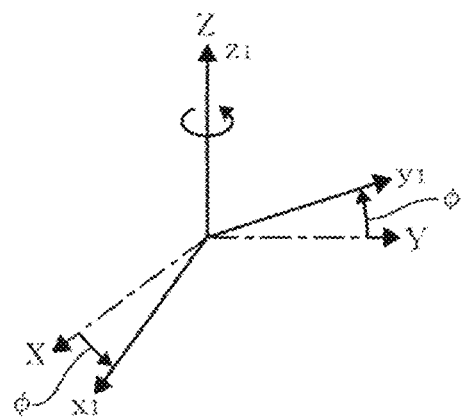
Figure 18C:
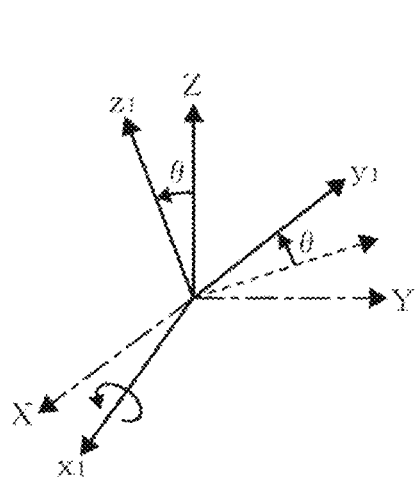
Figure 18D:
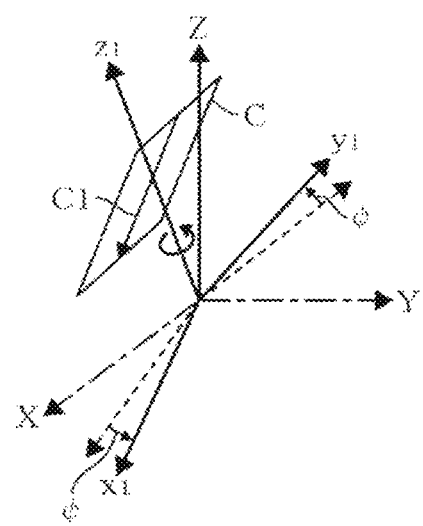

The respective ranges of hLT/λ and $hSiO_2/\lambda$ for the preferable TCF value described with FIG. 14 to FIG. 16 do not match the respective ranges of hLT/λ and $hSiO_2/\lambda$ for the preferable $k^2$ value described with FIG. 9 and FIG. 10. However, since it depends on circumstances which is more heavily weighed among the $k^2$ and the TCF, it is only necessary to set hLT/λ and $hSiO_2/\lambda$ to the respective preferable ranges for the heavily weighed one. Incidentally, for obtaining sufficient values of both $k^2$ and TCF, it is preferred to set respective hLT/λ and $hSiO_2/\lambda$ within a range indicated as a pentagon in the graph of FIG. 17. The graph of FIG. 17 specifies the range for obtaining the sufficient values of both $k^2$ and TCF by superimposing the graph of the TCF illustrated in FIG. 15 on the graph of the $k^2$ illustrated in FIG. 10. The graph of FIG. 17 has a horizontal axis (X-axis) indicating hLT/λ and a vertical axis (Y-axis) indicating $hSiO_2/\lambda$, and coordinates (hLT/λ, $hSiO_2/\lambda$) of apexes of the above-described pentagon are (0.1, 0.1), (0.4, 0.1), (0.3, 0.5), (0.2, 0.5), and (0.1, 0.4).

Now, a description will be given of the difference of the characteristics between the SAW device of the embodiment of the disclosure described with FIG. 2 and a SAW device of a comparative example with the specific values obtained through the first test. The SAW device of the comparative example is assumed to be configured similarly to the SAW device of the embodiment excluding that the amorphous $SiO_2$ layer 32 is not disposed. Therefore, the SAW device of the comparative example has a configuration where the electrode film 23 is disposed on the LT-quartz bonded substrate described in DESCRIPTION OF THE RELATED ART. This SAW device of the comparative example had Qr=5175, Qa=4410, $k^2$=12.99%, TCF-fr=−3.47 ppm/° C., and TCF-fa=−27.30 ppm/° C. at hLT/λ=0.18 and hAl/λ=0.06. In contrast, the SAW device of the embodiment had Qr=3847, Qa=3954, $k^2$=12.55%, TCF-fr=+11.93 ppm/° C., and TCF-fa=−11.33 ppm/° C. at hLT/λ=0.18, hAl/λ=0.06, and $hSiO_2/\lambda$=0.3. Accordingly, the SAW device of the embodiment has the significantly improved TCF with respect to the SAW device of the comparative example almost without deterioration of the Q factor and the $k^2$ value.

For the SAW device of the embodiment, a calculation of a parameter where TCF-fr and TCF-fa became closest to 0 ppm/° C. obtained Qr=4710, Qa=3963, $k^2$=9.54%, TCF-fr=+4.06 ppm/° C., TCF-fa=−0.43 ppm/° C. at hLT/λ=0.18, hAl/λ=0.06, and $hSiO_2/\lambda$=0.8. Accordingly, as a result, the $k^2$ decreased to about 0.73 times of the above-described case of hLT/λ=0.18, hAl/λ=0.06, and $hSiO_2/\lambda$=0.3, while the Q factor kept the approximately equivalent value with both TCF-fr and TCF-fa that became closer to 0 ppm/° C. Thus, the SAW device of the embodiment can reduce the problem that forming the electrode film on the LT-quartz bonded substrate deteriorates the TCF as described in DESCRIPTION OF THE RELATED ART.

[Second Test]

Subsequently, a description will be given of the second test performed to confirm the characteristics of the SAW device. In this second test, the SAW device was configured through the simulation such that the quartz layer 31, the piezoelectric layer 33, and the electrode film 23 constituting the electrode finger 18 were laminated in this order from the lower side. The piezoelectric layer 33 was formed of 36° Y—X LT similarly to the first test. In the second test, λ=2.1 μm and hLT/λ=0.15 were each set, and the electrode film 23 thickness (hAl/λ)=0.09 was set. An AT-cut blank was used as the quartz layer 31, and the relation between the propagation direction of the wave on the quartz layer 31 and the Q factors (Qr and Qa) was examined. Specifically, with the notation (φ, θ, ψ) with Euler angle, φ=0° and θ=125.25° were set, and the angle ψ was varied in a range of 0° to 360°.

This notation with Euler angle will be briefly described with reference to FIG. 18A to FIG. 18D. In the drawing, mutually orthogonal X-axis, Y-axis, and Z-axis are crystallographic axes of a quartz-crystal, and mutually orthogonal x1-axis, y1-axis, and z1-axis are coordinate axes of a coordinate system configured for identifying directions. In the state illustrated in FIG. 18A where the X, the Y, and the Z match the x1, the y1, and the z1, respectively, φ=0°, θ=0°, and ψ=0° are satisfied. The angle φ is an angle where the coordinate system of the x1, the y1, and the z1 are rotated in a right-screw direction with the Z-axis (at this point, matching the z1-axis) as a rotation axis from this state illustrated in FIG. 18A (see FIG. 18B). The angle θ is an angle where the coordinate system of the x1, the y1, and the z1 are rotated in the right-screw direction with the x1-axis as a rotation axis after that rotation around the Z-axis (see FIG. 18C). A surface perpendicular to this z1-axis is a cut surface C of the quartz layer 31. The angle ψ is an angle where the coordinate system of the x1, the y1, and the z1 are rotated in the right-screw direction with the z1-axis as a rotation axis after that rotation around the x1-axis (see FIG. 18D). A direction of the x1-axis determine by this rotation by the angle ψ is the propagation direction of the wave (indicated as an arrow C1). While the description has been given such that the coordinate system is rotated in the right-screw direction, this rotation in the right-screw direction is a rotation where the angles φ, θ, and ψ each have a + value. When the angles φ, θ, and ψ each have a − value, the coordinate system is rotated in an opposite direction.

Figure 19:
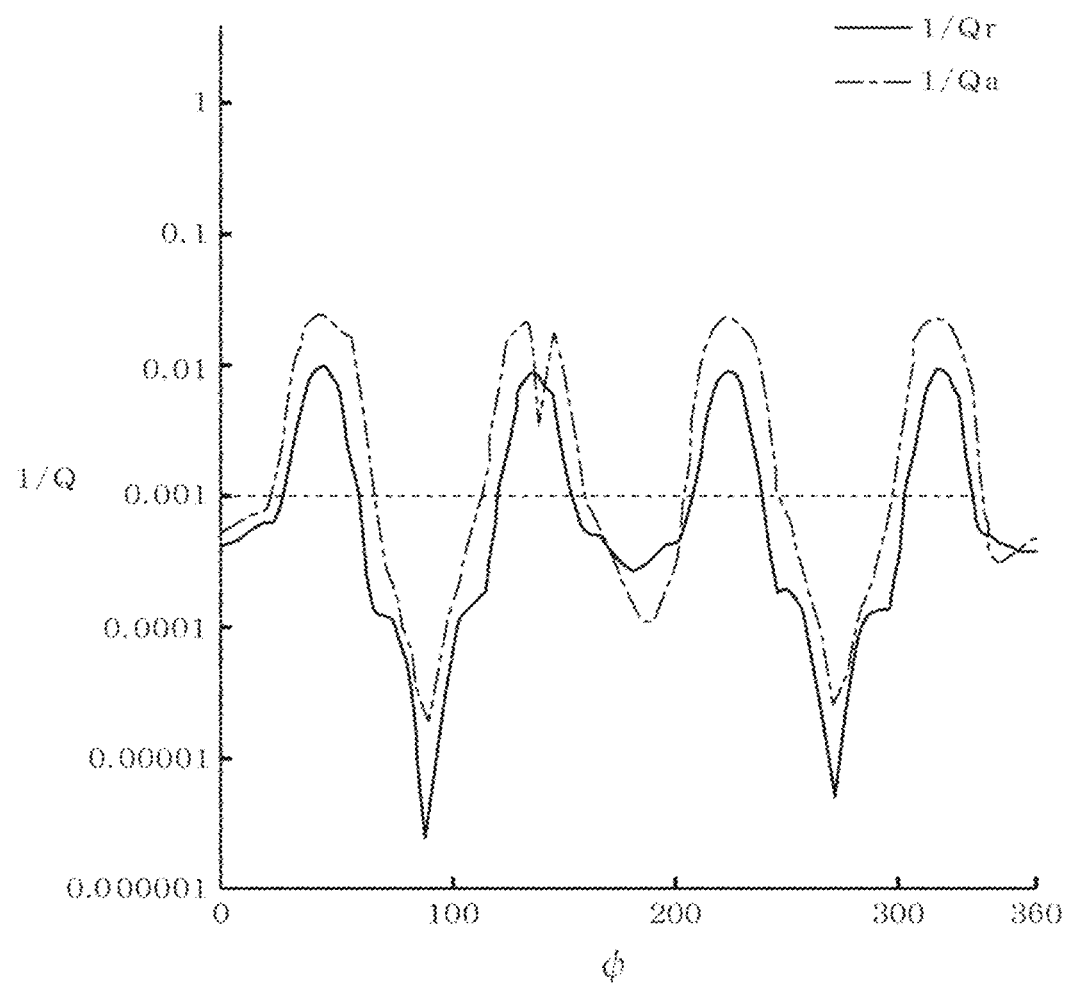
FIG. 19 is a graph illustrating relations between a SAW propagation direction and the Q factor.

The graph illustrated in FIG. 19 indicates the result of this test. The graph has a horizontal axis indicating the angle θ (unit: °) and a vertical axis indicating 1/Q. A solid line indicates the result of Qr and a chain line indicates the result of Qa. This graph indicates the result that 1/Qr and 1/Qa each mostly periodically repeated increase and decrease as the angle θ increased from 0°. As described above, when the SAW device is used in the bandwidth of 2 GHz or more, Q factor>1000 is preferable, thus 1/Qr and 1/Qa are preferred to be less than 0.001. Accordingly, from the graph, −20° (340°)≤ψ≤20°, 70°≤ψ≤110°, 160°≤ψ≤200°, and 250°≤ψ≤290° are preferable. 5°≤ψ≤5°, 85°≤ψ≤95°, 175°≤ψ≤185° and 265°≤ψ≤275° are more preferable because 1/Qr and 1/Qa are more decreased.

It is considered that for the quartz layer 31 of the SAW device that includes the substrate 3 and the electrode film 23 described with FIG. 2, setting the angle θ to the above-described range can provide the high Q factor. While φ=0° and θ=125.25° are set for (φ, θ, ψ), the Q factor is not likely to significantly vary when the respective angles φ and θ slightly vary from these values. Therefore, the Q factor is likely to be increased even if the angles φ and θ are set to the values in the ranges of, for example, −2°≤φ≤2° and 123.25°≤θ≤127.25°. While the description has been given that θ=−54.25° may be set because of the symmetry of the crystal, the value is allowed to slightly vary from this −54.25°, and may be set to −56.75°≤θ≤−52.75°.

Incidentally, a cut angle of LT constituting the piezoelectric layer 33 is only necessary to significantly drive a longitudinal wave or a transverse wave to be driven, and not limited to the above-described cut angle. For example, even the use of LT with a cut slightly different from 36° Y-cut is not likely to significantly change the characteristics of the SAW device from the above-described experimental results. For example, the piezoelectric layer 33 may include LT of 31° to 50° Y-cut. The piezoelectric layer 33 may be formed of, for example, a $LiNbO_3$, not limited to the LT, and even in that case, the SAW device is likely to obtain the characteristics mostly similar to that of the SAW device using LT.

The electrode film 23 may have any thickness, not limited to the above-described thickness. The material of the electrode film 23 is not limited to Al as described above, and may be a metal such as Au (gold), Cu (copper), Mo (molybdenum), W (tungsten), Pt (platinum), Sc (scandium), and Ti (titanium), or an alloy containing the above-described metal. The electrode film 23 may include a laminated body of the above-described metal. Incidentally, the laminated body of the electrode film 23 and the substrate 3 described with FIG. 2 is applicable to a duplexer where the ladder-type filters are applied to respective receiving side filter and transmitting side filter, or an oscillator using the SAW resonator 1 in addition to the ladder-type filter 10 illustrated in FIG. 1. That is, the SAW device of the disclosure is not limited to the ladder-type filter 10.

The other surface acoustic wave device according to the embodiment includes a quartz layer, an amorphous silicon oxide layer, a piezoelectric layer, and an Inter Digital Transducer. The amorphous silicon oxide layer is laminated on the quartz layer. The piezoelectric layer is laminated on the amorphous silicon oxide layer. The Inter Digital Transducer is formed on the piezoelectric layer. The Inter Digital Transducer excites a surface acoustic wave of 2 GHz or more on the piezoelectric layer. Assuming that the surface acoustic wave has a wavelength λ, a thickness of the amorphous silicon oxide layer/λ≤1.

With the surface acoustic wave device according to the embodiment, for the surface acoustic wave device where the quartz layer, the amorphous silicon oxide layer, the piezoelectric layer, and the Inter Digital Transducer are laminated in this order, setting the thickness of the amorphous silicon oxide layer and the thickness of the piezoelectric layer to the appropriate values provides the sufficient characteristics. For the surface acoustic wave device that excites the surface acoustic wave of 2 GHz or more, setting the thickness of the amorphous silicon oxide layer to the appropriate value provides the sufficient frequency versus temperature characteristic and other characteristics.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface acoustic wave device, comprising:
   a quartz layer;
   an amorphous silicon oxide layer, being laminated on the quartz layer;
   a piezoelectric layer, being laminated on the amorphous silicon oxide layer; and
   an Inter Digital Transducer, being formed on the piezoelectric layer, and the Inter Digital Transducer exciting a surface acoustic wave on the piezoelectric layer,
   wherein
   assuming that the surface acoustic wave has a wavelength λ,
   0.6≤a thickness of the amorphous silicon oxide layer/λ≤1, and
   0.4≤a thickness of the piezoelectric layer/λ≤0.7,
   wherein the quartz layer has a cut surface, and
   the surface acoustic wave has a propagation direction,
   the cut surface and the propagation direction are notated as (φ, θ, ψ) with Euler angle, wherein $0<\phi\leq 2°$, $-56.75° \leq \theta \leq -52.75°$, and $70° \leq \psi \leq 110°, 160° \leq \psi \leq 200°$, or $250° \leq \psi \leq 290°$, wherein Q factor of the surface acoustic wave device at a resonance point (Qr) or Q factor of the surface acoustic wave device at an anti-resonance point (Qa) equals to 5000 or more.

2. The surface acoustic wave device according to claim 1, wherein
the surface acoustic wave has a frequency of 2 GHz or more.

3. The surface acoustic wave device according to claim 2, wherein
the thickness of the piezoelectric layer/$\lambda$<0.5.

4. The surface acoustic wave device according to claim 1, wherein
the thickness of the piezoelectric layer/$\lambda$ and the thickness of the amorphous silicon oxide layer/$\lambda$ are each included in a region of a heptagon obtained by connecting coordinates with straight lines,
the coordinates are indicated as (the thickness of the piezoelectric layer/$\lambda$, the thickness of the amorphous silicon oxide layer/$\lambda$), when a graph has the thickness of the piezoelectric layer/$\lambda$ on a horizontal axis and the thickness of the amorphous silicon oxide layer/$\lambda$ on a vertical axis,
the coordinates are (0.2, 0.4), (0.3, 0.4), (0.4, 0.6), (0.7, 0.9), (0.5, 1.0), (0.3, 1.0), and (0.2, 0.8).

5. The surface acoustic wave device according to claim 1, wherein
the thickness of the piezoelectric layer/$\lambda$ and the thickness of the amorphous silicon oxide layer/$\lambda$ are each included in a region of a pentagon obtained by connecting coordinates with straight lines,
the coordinates are indicated as (the thickness of the piezoelectric layer/$\lambda$, the thickness of the amorphous silicon oxide layer/$\lambda$), when a graph has the thickness of the piezoelectric layer/$\lambda$ on a horizontal axis and the thickness of the amorphous silicon oxide layer/$\lambda$ on a vertical axis,
the coordinates are (0.1, 0.1), (0.4, 0.1), (0.3, 0.5), (0.2, 0.5), and (0.1, 0.4).

6. A surface acoustic wave device, comprising:
a quartz layer;
an amorphous silicon oxide layer, being laminated on the quartz layer;
a piezoelectric layer, being laminated on the amorphous silicon oxide layer; and
an Inter Digital Transducer, being formed on the piezoelectric layer, and the Inter Digital Transducer exciting a surface acoustic wave on the piezoelectric layer,
wherein
assuming that the surface acoustic wave has a wavelength $\lambda$,
$0.6 \leq$ a thickness of the amorphous silicon oxide layer/$\lambda \leq 1$, and
$0.4 \leq$ a thickness of the piezoelectric layer/$\lambda \leq 0.7$,
wherein Q factor of the surface acoustic wave device at a resonance point (Qr) or Q factor of the surface acoustic wave device at an anti-resonance point (Qa) equals to 5000 or more.

7. The surface acoustic wave device according to claim 6, wherein
the surface acoustic wave has a frequency of 2 GHz or more.

8. The surface acoustic wave device according to claim 7, wherein
the thickness of the piezoelectric layer/$\lambda$<0.5.

9. The surface acoustic wave device according to claim 6, wherein
the thickness of the piezoelectric layer/$\lambda$ and the thickness of the amorphous silicon oxide layer/$\lambda$ are each included in a region of a heptagon obtained by connecting coordinates with straight lines,
the coordinates are indicated as (the thickness of the piezoelectric layer/$\lambda$, the thickness of the amorphous silicon oxide layer/$\lambda$), when a graph has the thickness of the piezoelectric layer/$\lambda$ on a horizontal axis and the thickness of the amorphous silicon oxide layer/$\lambda$ on a vertical axis,
the coordinates are (0.2, 0.4), (0.3, 0.4), (0.4, 0.6), (0.7, 0.9), (0.5, 1.0), (0.3, 1.0), and (0.2, 0.8).

10. The surface acoustic wave device according to claim 6, wherein
the thickness of the piezoelectric layer/$\lambda$ and the thickness of the amorphous silicon oxide layer/$\lambda$ are each included in a region of a pentagon obtained by connecting coordinates with straight lines,
the coordinates are indicated as (the thickness of the piezoelectric layer/$\lambda$, the thickness of the amorphous silicon oxide layer/$\lambda$), when a graph has the thickness of the piezoelectric layer/$\lambda$ on a horizontal axis and the thickness of the amorphous silicon oxide layer/$\lambda$ on a vertical axis,
the coordinates are (0.1, 0.1), (0.4, 0.1), (0.3, 0.5), (0.2, 0.5), and (0.1, 0.4).

* * * * *